United States Patent
Terada

(10) Patent No.: US 10,319,787 B2
(45) Date of Patent: Jun. 11, 2019

(54) MEMORY DEVICE AND MEMORY SYSTEM

(71) Applicant: SONY SEMICONDUCTOR SOLUTIONS CORPORATION, Kanagawa (JP)

(72) Inventor: Haruhiko Terada, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/579,302

(22) PCT Filed: May 18, 2016

(86) PCT No.: PCT/JP2016/064772
§ 371 (c)(1),
(2) Date: Dec. 4, 2017

(87) PCT Pub. No.: WO2016/199556
PCT Pub. Date: Dec. 15, 2016

(65) Prior Publication Data
US 2018/0175108 A1  Jun. 21, 2018

(30) Foreign Application Priority Data
Jun. 10, 2015 (JP) .................................. 2015-117228

(51) Int. Cl.
*H01L 27/24* (2006.01)
*G11C 29/00* (2006.01)
(Continued)

(52) U.S. Cl.
CPC ............ *H01L 27/249* (2013.01); *G11C 29/80* (2013.01); *H01L 23/528* (2013.01);
(Continued)

(58) Field of Classification Search
CPC ............ H01L 27/249; H01L 27/11551; H01L 27/226; H01L 27/228; H01L 23/528;
(Continued)

(56) References Cited

U.S. PATENT DOCUMENTS 9,076,723 B1 * 7/2015 Matsunami ........... H01L 45/085
2009/0180339 A1  7/2009 Kim et al.
(Continued)

FOREIGN PATENT DOCUMENTS

JP  2009-170082  7/2009
JP  2011-114011  6/2011
(Continued)

OTHER PUBLICATIONS

International Search Report prepared by the Japan Patent Office dated Jul. 19, 2016, for International Application No. PCT/JP2016/064772.

*Primary Examiner* — Sitaramarao S Yechuri
(74) *Attorney, Agent, or Firm* — Sheridan Ross P.C.

(57) ABSTRACT

Provided is a memory device that has a structure suitable for still higher integration while securing production easiness, and includes n memory cell units stacked, on a substrate, in order as first to n-th memory cell units in a first direction. The n memory cell units each include: one or more first electrodes; a plurality of second electrodes each provided to intersect the first electrode; a plurality of memory cells provided at respective intersections of the first electrode and the second electrodes and each coupled to both the first and second electrodes; and one or more lead lines coupled to the first electrode to form one or more coupling parts, which, in (m+1)-th memory cell unit, are located at a position where the coupling parts and m-th memory cell region surrounded by the memory cells in m-th memory cell unit overlap each other in the first direction.

18 Claims, 41 Drawing Sheets

(51) Int. Cl.
*H01L 23/528* (2006.01)
*H01L 27/11551* (2017.01)
*H01L 27/22* (2006.01)
*H01L 45/00* (2006.01)
*H01L 27/06* (2006.01)

(52) U.S. Cl.
CPC ...... *H01L 27/11551* (2013.01); *H01L 27/226* (2013.01); *H01L 27/228* (2013.01); *H01L 45/06* (2013.01); *H01L 45/122* (2013.01); *H01L 45/1253* (2013.01); *H01L 27/0688* (2013.01); *H01L 45/085* (2013.01); *H01L 45/1226* (2013.01); *H01L 45/1266* (2013.01)

(58) Field of Classification Search
CPC ... H01L 45/06; H01L 45/122; H01L 45/1253; G11C 29/80
See application file for complete search history.

(56) References Cited

U.S. PATENT DOCUMENTS

| | | | |
|---|---|---|---|
| 2011/0183511 A1* | 7/2011 | Maekawa | H01L 27/115 438/593 |
| 2011/0316072 A1 | 12/2011 | Lee | |
| 2014/0056055 A1 | 2/2014 | Ikeda et al. | |
| 2014/0246646 A1* | 9/2014 | Sasago | H01L 27/2409 257/5 |
| 2015/0325628 A1 | 11/2015 | Nonoguchi et al. | |
| 2016/0343727 A1* | 11/2016 | Kim | H01L 27/11582 |

FOREIGN PATENT DOCUMENTS

| | | |
|---|---|---|
| JP | 2011-222994 | 11/2011 |
| WO | WO 2012/070236 | 5/2012 |
| WO | WO 2013/076935 | 5/2013 |
| WO | WO 2014/103577 | 7/2014 |

* cited by examiner

MEMORY DEVICE AND MEMORY SYSTEM

CROSS REFERENCE TO RELATED APPLICATIONS

This application is a national stage application under 35 U.S.C. 371 and claims the benefit of PCT Application No. PCT/JP2016/064772 having an international filing date of 18 May 2016, which designated the United States, which PCT application claimed the benefit of Japanese Patent Application No. 2015-117228 filed 10 Jun. 2015, the disclosures of which are incorporated herein by reference in their entirety.

TECHNICAL FIELD

The disclosure relates to a memory device including a plurality of non-volatile storage sections, and to a memory system.

BACKGROUND ART

Up until now, a memory device including a plurality of non-volatile memory cells has been studied in terms of improvement in an integration degree of the memory cells. In recent years, in order to cope with still higher integration of the memory cells, a memory device has been proposed in which a plurality of memory cells are arrayed three-dimensionally (see, e.g., PTLs 1 to 3).

CITATION LIST

Patent Literature

PTL 1: Japanese Unexamined Patent Application Publication No. 2011-222994
PTL 2: International Publication No. WO 2012/070236 Specification
PTL 3: Japanese Unexamined Patent Application Publication No. 2011-114011

SUMMARY OF INVENTION

Incidentally, there have recently been increasing demands for still higher integration of the memory cells.

It is therefore desirable to provide a memory device having a structure suitable for still higher integration while ensuring easiness in production. Further, it is desirable to provide a memory system including such a memory device.

A memory device according to an embodiment of the disclosure is provided with n-number of memory cell units that are provided on a substrate and stacked in order as a first memory cell unit to an n-th memory cell unit in a first direction. The n-number of memory cell units each include one or more first electrodes, a plurality of second electrodes, a plurality of memory cells, and one or more lead lines. The plurality of second electrodes are each provided to intersect the first electrode. The plurality of memory cells are provided at respective intersections of the first electrode and the plurality of second electrodes. The plurality of memory cells are each coupled to both of the first electrode and the second electrode. The one or more lead lines are coupled to the first electrode to form one or more coupling parts. Here, the one or more coupling parts in an (m+1)-th (m denotes a natural number equal to or smaller than n) memory cell unit are located at a position where the one or more coupling parts and an m-th memory cell region surrounded by the plurality of memory cells in an m-th memory cell unit overlap each other in the first direction. In other words, the memory device allows a projection image in the m-th memory cell region in the first direction and a projection image in the coupling part in the (m+1)-th memory cell unit in the first direction to overlap each other.

A memory system according to an embodiment of the disclosure includes the above-described memory device and a controller that controls the memory device.

In the memory device and the memory system according to the respective embodiments of the disclosure, the one or more coupling parts in the (m+1)-th memory cell unit are located at the position where the one or more coupling parts and the memory cell region in the m-the memory cell unit overlap each other. Thus, it is possible to allow the memory device as a whole to have more memory cells in a predetermined space.

According to the memory device and the memory system as the respective embodiments of the disclosure, it becomes possible to achieve higher integration. It is to be noted that the effects of the disclosure are not limited to those described above, and may be any of effects described hereinafter.

MODES FOR CARRYING OUT THE INVENTION

In the following, some embodiments of the disclosure are described in detail with reference to drawings. It is to be noted that description is given in the following order.
1. First Embodiment (A memory device in which a plurality of WLs are disposed stepwise)
2. Modification Example 1 (First Modification Example of First Embodiment)
3. Modification Example 2 (Second Modification Example of First Embodiment)
4. Second Embodiment (A memory device including a resistance change element having substantially same planar shape as that of WL)
5. Third Embodiment (Another memory device including a resistance change element having the substantially same planar shape as that of WL)
6. Application Example (A memory system including a memory device)

1. First Embodiment

[Configuration of Memory Device 1]

Figure 1:
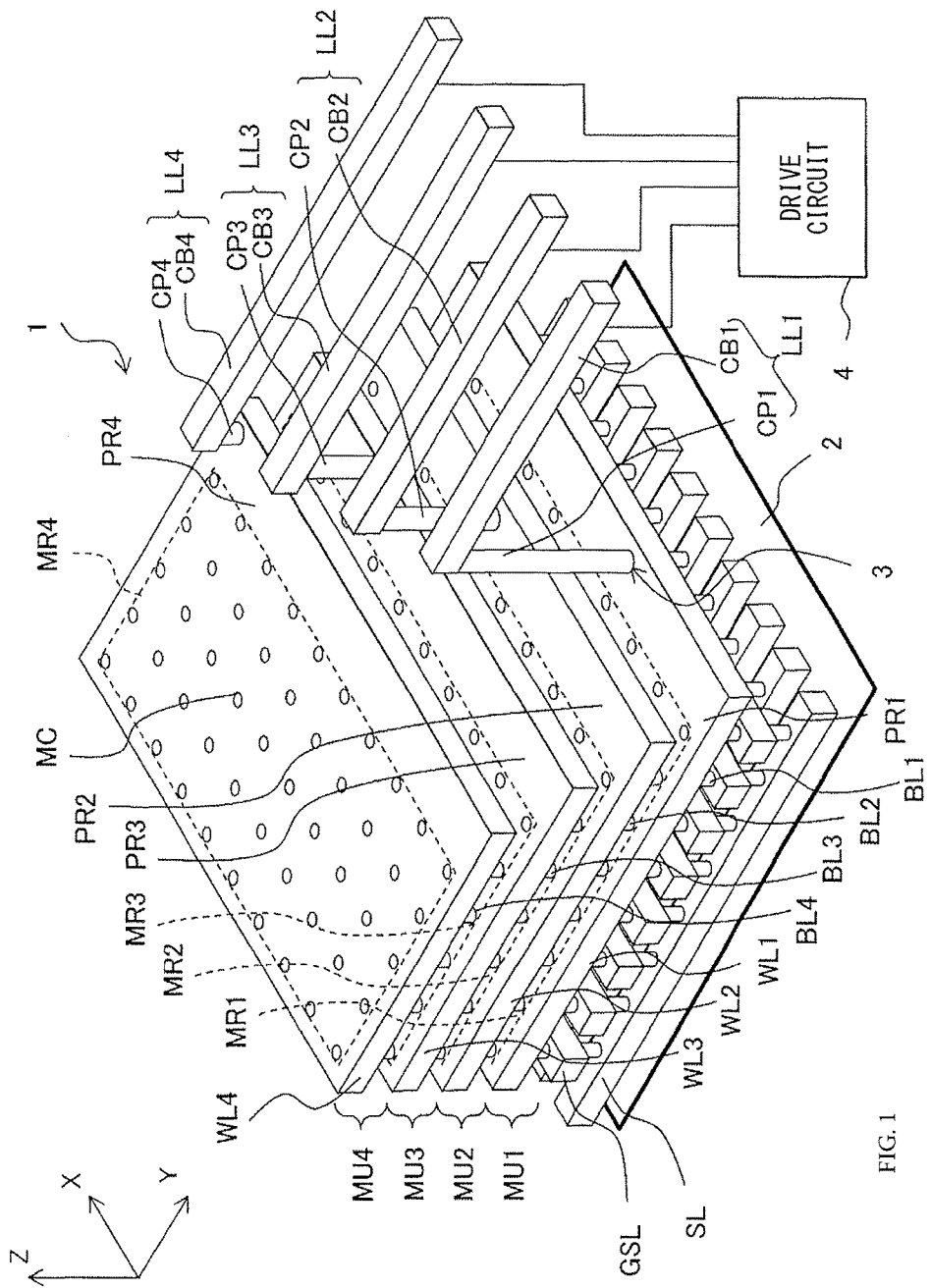
FIG. 1 is a perspective view of an overall configuration example of a memory device according to a first embodiment of the disclosure.
Figure 2:
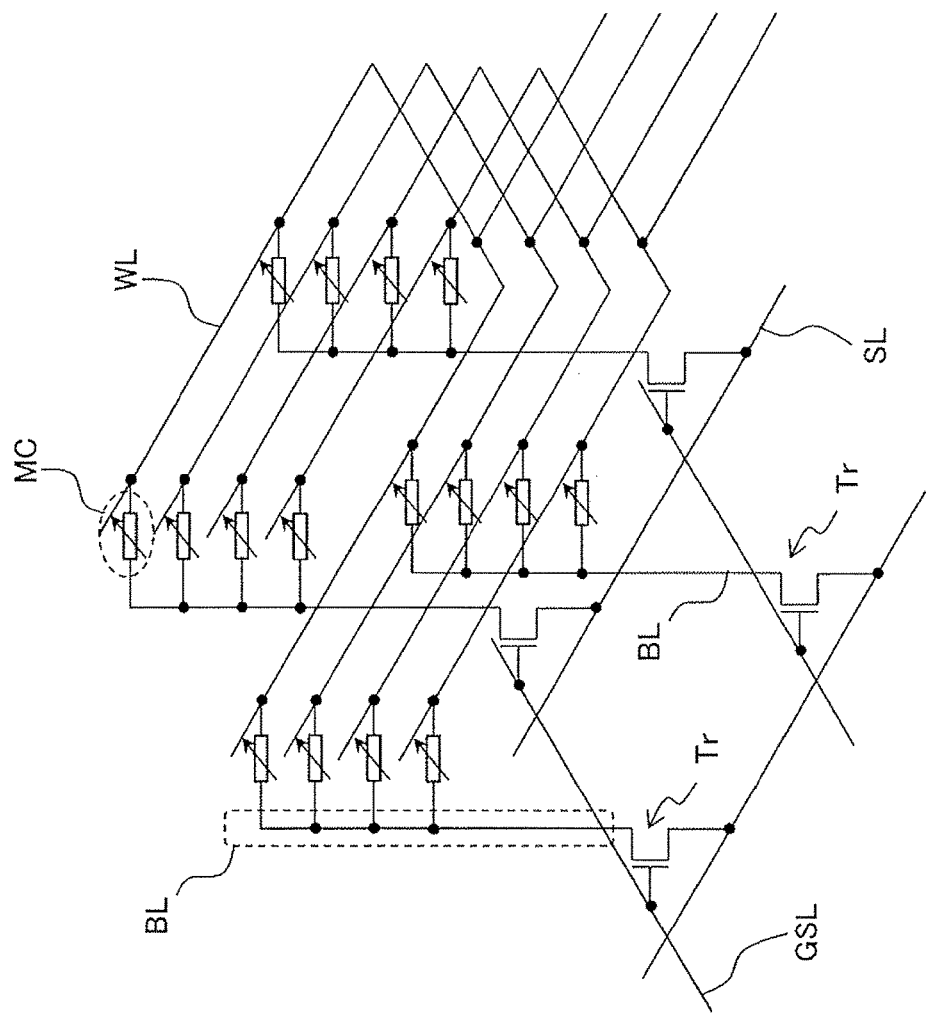
FIG. 2 is an equivalent circuit diagram illustrating a portion of the memory device illustrated in FIG. 1.

FIG. 1 is a perspective view of an overall configuration example of a memory device 1 according to a first embodiment of the disclosure. Further, FIG. 2 is an equivalent circuit diagram illustrating a portion of the memory device 1 of FIG. 1.

The memory device 1 is a non-volatile storage having a three-dimensional structure, and includes, on a semiconductor substrate 2 (hereinafter, referred to simply as substrate 2), n-number of memory cell units MU. The semiconductor substrate 2 has a principal surface that extends in an X-axis direction and in a Y-axis direction. In the n-number of memory cell units MU, a first memory cell unit to an n-th memory cell unit are stacked in order in a Z-axis direction. FIGS. 1 and 2 illustrate a case of n=4, i.e., a case where four memory cell units MU1 to MU4 are stacked in order. In addition, FIG. 2 illustrates only a portion of the four memory cell units MU1 to MU4.

The n-number of memory cell units MU each include one plate-shaped electrode WL, a plurality of columnar electrodes BL, a plurality of memory cells MC, and a lead line 4. The plurality of columnar electrodes BL are each provided to intersect the plate-shaped electrode WL. The plurality of memory cells MC are provided at respective intersections of the plate-shaped electrode WL and the plurality of columnar electrodes BL, and are each coupled to both of the plate-shaped electrode WL and the columnar electrode BL. The lead line 4 is coupled to the plate-shaped electrode WL to form a coupling part 3. The plate-shaped electrode WL extends along an X-Y plane, and is provided in common for the plurality of columnar electrodes BL that form each memory cell unit MU. The plurality of columnar electrodes BL each standing from the plate-shaped electrode WL toward the substrate 2. It is to be noted that, here, the columnar electrodes BL that are in a mutually overlapping position in the Z-direction, among the plurality of columnar electrodes BL provided in the memory cell units MU1 to MU4, are linked together by penetration of the plate-shaped electrode WL. Further, in the X-Y plane, the plate-shaped electrode WL(m+1) in the (m+1)-th memory cell unit MU(m+1) has an occupation area that is smaller than an occupation area of the plate-shaped electrode WLm in the m-th memory cell unit MUm. That is, the plate-shaped electrode WL2 in the memory cell unit MU2 has an occupation area that is smaller than an occupation area of the plate-shaped electrode WL1 in the memory cell unit MU1. The plate-shaped electrode WL3 in the memory cell unit MU3 has an occupation area that is smaller than an occupation area of the plate-shaped electrode WL2 in the memory cell unit MU2. The plate-shaped electrode WL3 in the memory cell unit MU3 has an occupation area that is smaller than an occupation area of the plate-shaped electrode WL2 in the memory cell unit MU2. The plate-shaped electrode WL4 in the memory cell unit MU4 has an occupation area that is smaller than an occupation area of the plate-shaped electrode WL3 in the memory cell unit MU3. In this manner, an occupation area of the plate-shaped electrode WL becomes gradually smaller as the plate-shaped electrode WL is away from the substrate 2 to form a stepped structure as a whole.

Figure 3:
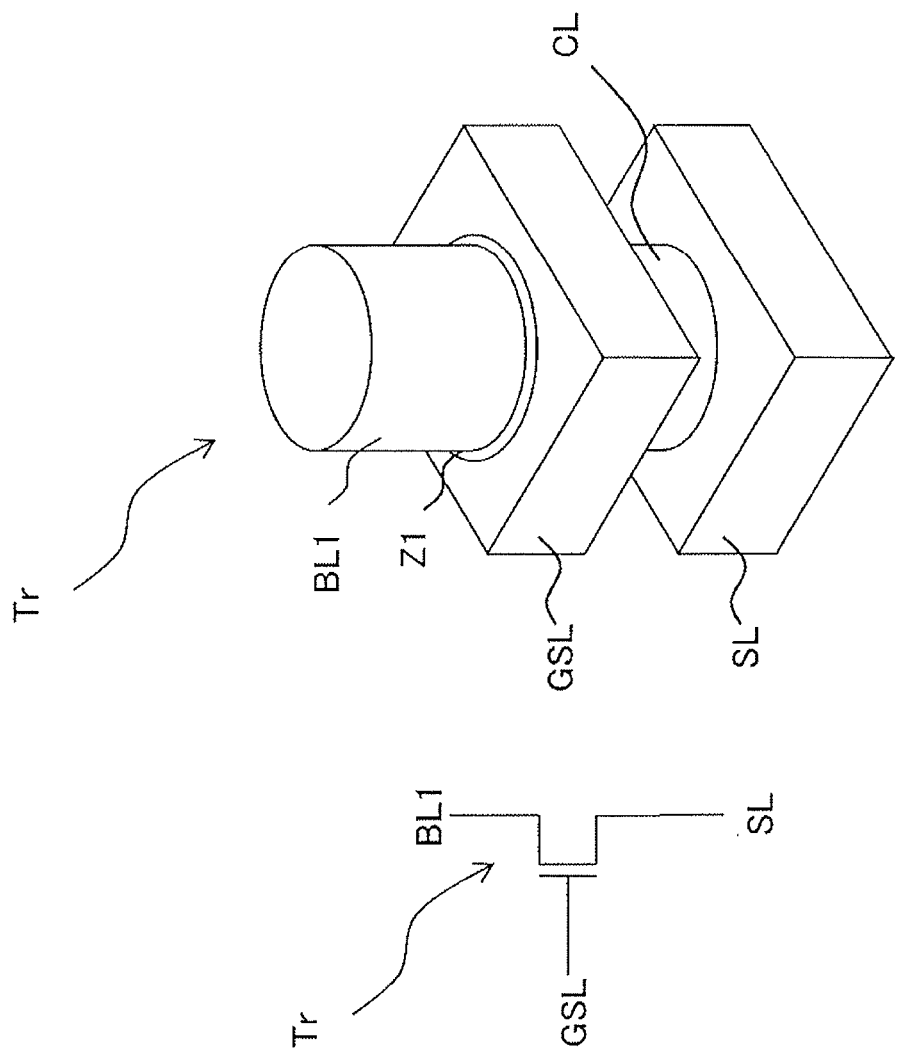
FIG. 3 is an enlarged perspective view of an example of a selection transistor to be applied to the memory device illustrated in FIG. 1.

A plurality of selection transistors Tr that each serve as a depletion (Depletion) transistor are provided, between the first (i.e., lowermost layer) memory cell unit MU1 and the substrate 2, on extensions of the respective columnar electrodes BL. FIG. 3 is an enlarged perspective view of a configuration example of the selection transistor Tr (right side in the drawing), together with its corresponding equivalent circuit diagram (left side in the drawing). As illustrated in FIG. 3, at the lower part of the memory cell unit MU1, there are provided a plurality of gate selection lines GSL that extend in the X-axis direction, and are arranged in the Y-axis direction. Further, at the lower part of the plurality of gate selection lines GSL, there are provided a plurality of source lines SL that extend in the Y-axis direction, and are arranged in the X-axis direction. At each of intersections of the plurality of gate selection lines GSL and the plurality of source lines SL, there is provided a contact line CL that links the gate selection line GSL and the source line SL to each other. Further, a columnar electrode BL1 of the lowermost-layer memory cell unit MU1 penetrates the gate selection line GSL to be brought into contact with the contact line CL. However, the columnar electrode BL1 and the gate selection line GSL are electrically insulated from each other by an insulating layer Z1 provided therebetween.

As a constituent material of the source line SL, metal containing Cu, Al, or W, for example, is preferable. Alternatively, a material with electric conductivity containing one or more elements of C, Si, Ge, In, and Ga (e.g., a carbon nanotube, activated polysilicon, etc.) may also be used. Further, it is also possible for other various wiring lines and various electrodes such as the gate selection line GSL, the plate-shaped electrode WL, and the columnar electrode BL to be made of a material similar to the constituent material of the source line SL, unless otherwise stated.

As illustrated in FIG. 1, the plurality of memory cell units MU (MU1 to MU4) include, respectively, memory cell regions MR (MR1 to MR4) and peripheral regions PR (PR1 to PR4). The memory cell region MR is a region occupied by the plurality of memory cells MC. More specifically, the memory cell region MR refers to a region surrounded by a virtual line (region surrounded by a broken line in FIG. 1) that sequentially links several memory cells MC located outermost within the X-Y plane, among all the memory cells MC included in each memory cell unit MU. In contrast, the peripheral region PR refers to a remaining region excluding the memory cell region MR, out of a region occupied by the plate-shaped electrode WL that forms each memory cell unit MU.

Figure 4A:
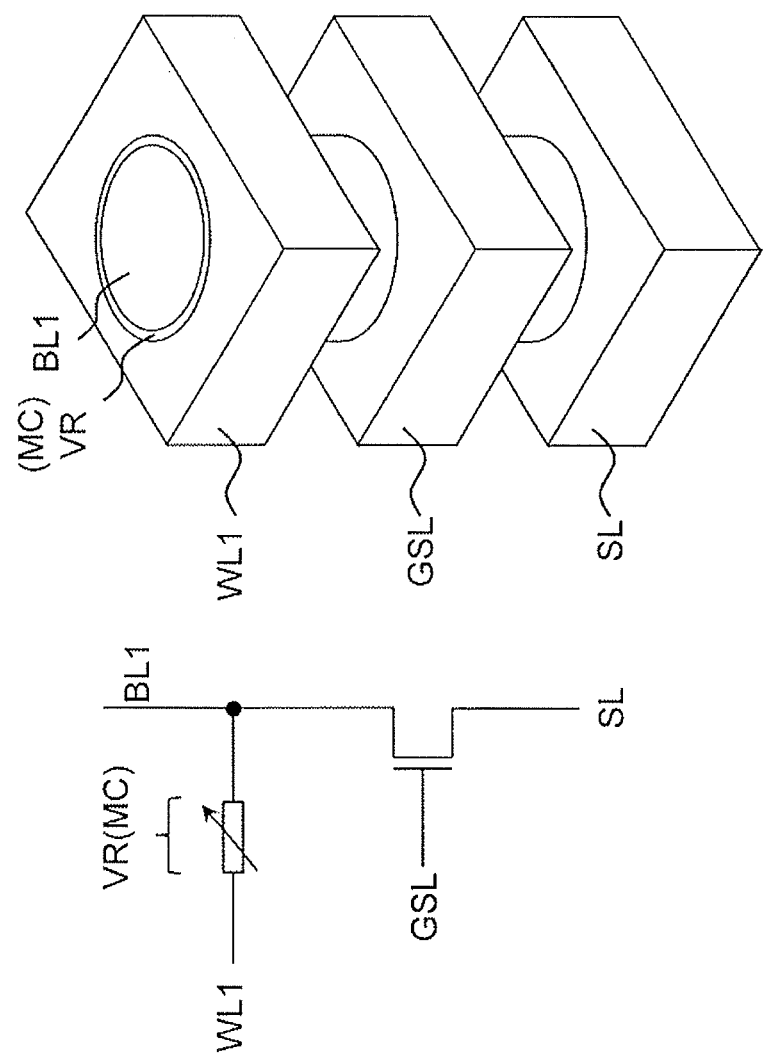
FIG. 4A is an enlarged perspective view of a memory cell to be applied to the memory device illustrated in FIG. 1, together with its equivalent circuit diagram.
Figure 4B:
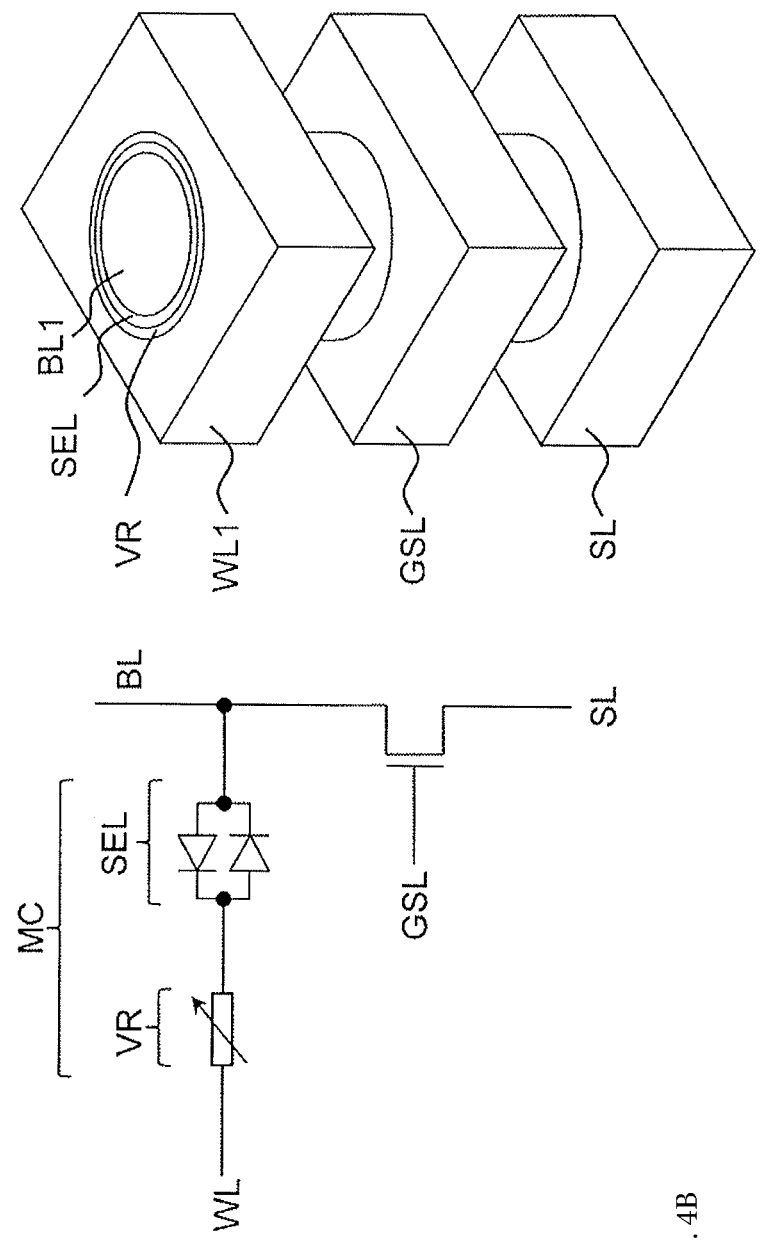
FIG. 4B is an enlarged perspective view of another memory cell to be applied to the memory device illustrated in FIG. 1, together with its equivalent circuit diagram.

FIG. 4A illustrates an enlarged perspective view of a configuration example of the memory cell MC (right side in the drawing), together with its corresponding equivalent circuit diagram (left side in the drawing). FIG. 4A illustrates, as a representative, a vicinity of any given one memory cell MC in the first memory cell unit MU1. As illustrated in FIG. 4A, the columnar electrode BL1 of the lowermost-layer memory cell unit MU1 penetrates the plate-shaped electrode WL1 in the Z-axis direction. Other memory cell units MU2 to MU 4 also have similar configurations. That is, the columnar electrode BL2 penetrates the plate-shaped electrode WL2 in the Z-axis direction; the columnar electrode BL3 penetrates the plate-shaped electrode WL3 in the Z-axis direction; and the columnar electrode BL4 penetrates the plate-shaped electrode WL4 in the Z-axis direction. However, the columnar electrodes BL1 to BL4 and the plate-shaped electrodes WL1 to BL are separated, respectively, from each other by a resistance change element VR as the memory cell MC provided to be interposed therebetween. It is to be noted that, as illustrated in FIG. 4B, each memory cell MC mounted in the memory device 1 may have a configuration in which a selection element SEL is inserted between the columnar electrode BL1 and the resistance change element VR. In any memory cell MC illustrated in FIGS. 4A and 4B, an access current is applied between the source line SL and the plate-shaped electrode WL, and a voltage of the gate selection line GSL is controlled to impart an access pulse to the resistance change element VR to enable a resistance state thereof to be changed or to be read. However, the selection element SEL in FIG. 4B serves to prevent erroneous access to a non-selected resistance change element VR by causing a current to flow to the resistance change element VR only when an access pulse greater than a certain voltage is applied.

The resistance change element VR is configured by a stacked structure of an ion supply layer and an insulating layer, for example. Examples of a material of the ion supply layer include a metal film containing one or more metal elements selected from Cu, Ag, Zr, and Al, an alloy film (e.g., CuTe alloy film), and a metal compound film. It is to be noted that metal elements other than Cu, Ag, Zr, and Al may also be used as long as the metal elements have an easily-ionizable property. Further, it is desirable that an element to be combined with one or more of Cu, Ag, Zr, and Al be an element of one or more of S, Se, and Te. Furthermore, examples of a constituent material of the insulating layer in the resistance change element VR include SiN, $SiO_2$, and $Gd_2O_3$.

In the memory device 1, a size of an (m+1)-th memory cell region MR(m+1) in the (m+1)-th memory cell unit MU(m+1) is narrower than a size of the m-th memory cell region MRm. Further, the number of the plurality of memory cells MC (number of columnar electrodes BL(m+1)) in the (m+1)-th memory cell unit MU(m+1) is smaller than number of the plurality of memory cells MC (number of columnar electrode BLm) in the m-th memory cell unit MUm. In the example of FIG. 1, the memory cell region MR1 in the memory cell unit MU1 has a total of 80 memory cells MC and 80 columnar electrodes BL1 that are disposed (to have 10 pieces in the X direction and 8 pieces in the Y direction). In contrast, the memory cell region MR2 in the memory cell unit MU2 has a total of 70 memory cells MC and 70 columnar electrodes BL2 that are disposed (to have 10 pieces in the X direction and 7 pieces in the Y direction). Further, the memory cell region MR3 in the memory cell unit MU3 has a total of 60 memory cells MC and 60 columnar electrodes BL3 that are disposed (to have 10 pieces in the X direction and 6 pieces in the Y direction). Furthermore, the memory cell region MR4 in the memory cell unit MU4 has a total of 50 memory cells MC and 50 columnar electrodes BL4 that are disposed (to have 10 pieces in the X direction and 5 pieces in the Y direction).

A lead line LL (LL1 to LL4) includes a contact pillar CP (CP1 to CP4) and a beam CB (CB1 to CB4). The contact pillar CP (CP1 to CP4) forms the coupling part 3 with respect to the first electrode WL, and extends upward from the coupling part 3, i.e., in a direction away from the substrate 2. The beam CB (CB1 to CB4) is coupled to an upper end of the contact pillar CP (CP1 to CP4), and extends within the X-Y plane (in Y-axis direction in FIG. 1). The other end of the beam CB is coupled to a drive circuit 4. The drive circuit 4 is embedded in the substrate 2, for example, and executes a writing operation into a desired memory cell MC and a reading operation from the desired memory cell MC. The drive circuit 4 adjusts, on the basis of a control signal from the outside, for example, a voltage to be applied to the plate-shaped electrode WL, the columnar electrode BL, and the gate selection line of the selection transistor Tr that correspond to the desired memory cell MC. It is to be noted that a plurality of lead lines LL (LL1 to LL4) may be provided for one plate-shaped electrode WL (WL1 to WL4).

One or more coupling parts 3 in the (m+1)-th memory cell unit MU(m+1) are located at a position where a peripheral region PR(m+1) and the m-th memory cell region MRm surrounded by the plurality of memory cells MC in the m-th memory cell unit MUm overlap each other in the Z-axis direction. That is, the coupling part 3 in the memory cell unit MU2 is located at a position where the peripheral region PR2 and the memory cell region MR1 overlap each other in the Z-axis direction. The coupling part 3 in the memory cell unit MU3 is located at a position where the peripheral region PR3 and the memory cell region MR2 overlap each other in the Z-axis direction. The coupling part 3 in the memory cell unit MU4 is located at a position where the peripheral region PR4 and the memory cell region MR3 overlap each other in the Z-axis direction. In FIG. 1, in particular, the coupling part 3 in the (m+1)-th memory cell unit MU(m+1) is located at a position where the coupling part 3 and any of the plurality of memory cells MC in the m-th memory cell unit MUm overlap each other in the Z-axis direction.

[Manufacturing Method of Memory Device 1]

The memory device 1 is able to be manufactured as follows, for example.

Figure 5A:
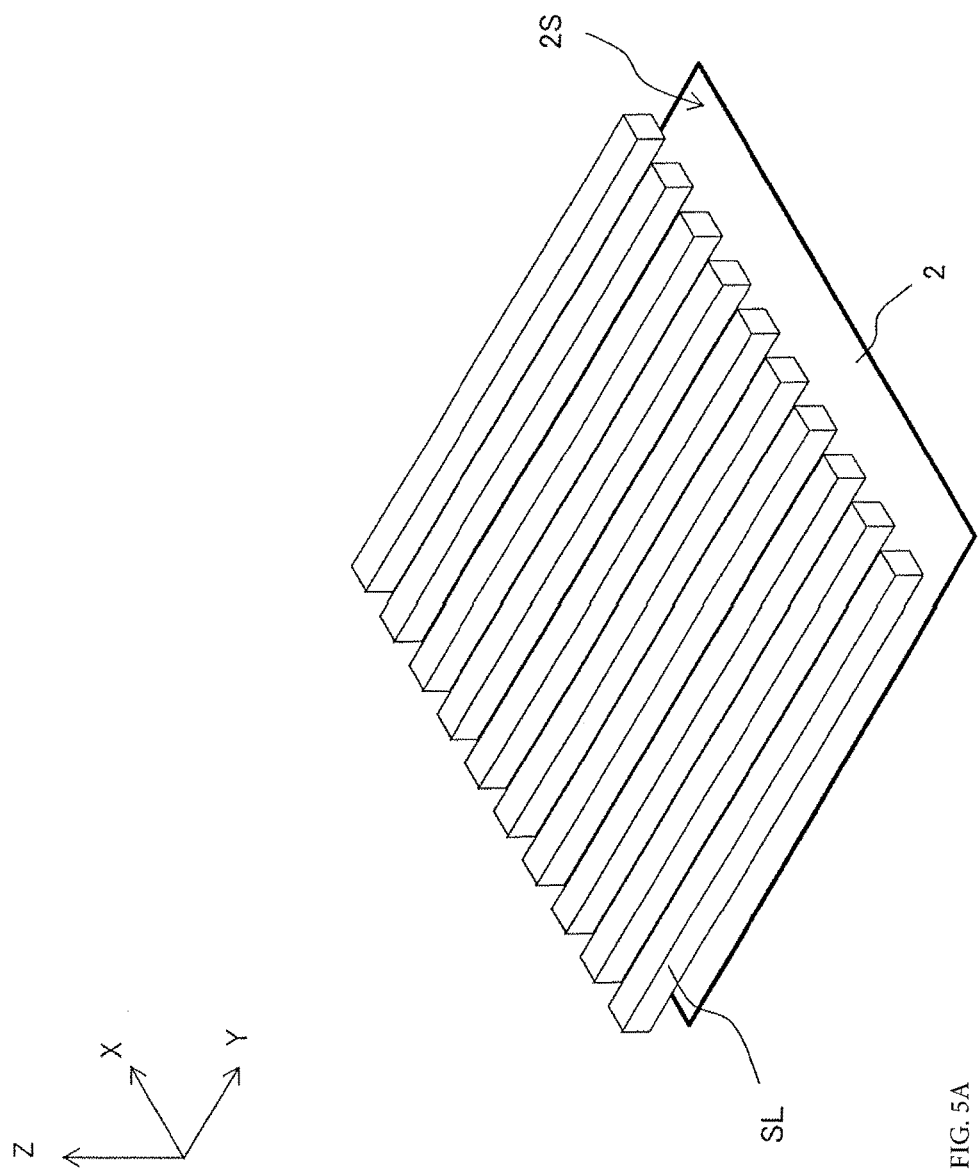
FIG. 5A is a perspective view of one step in a manufacturing method of the memory device illustrated in FIG. 1.

FIGS. 5A to 5E illustrate a portion of a manufacturing method of the memory device 1 in order of steps. First, as illustrated in FIG. 5A, the substrate 2 having a principal surface 2S along the X-Y plane is prepared, and the drive circuit 4 (not illustrated here) is formed on the principal surface 2S. Thereafter, the plurality of source lines SL extending in the Y-axis direction are formed, on the substrate 2, to be arranged in the X-axis direction.

Figure 5B:
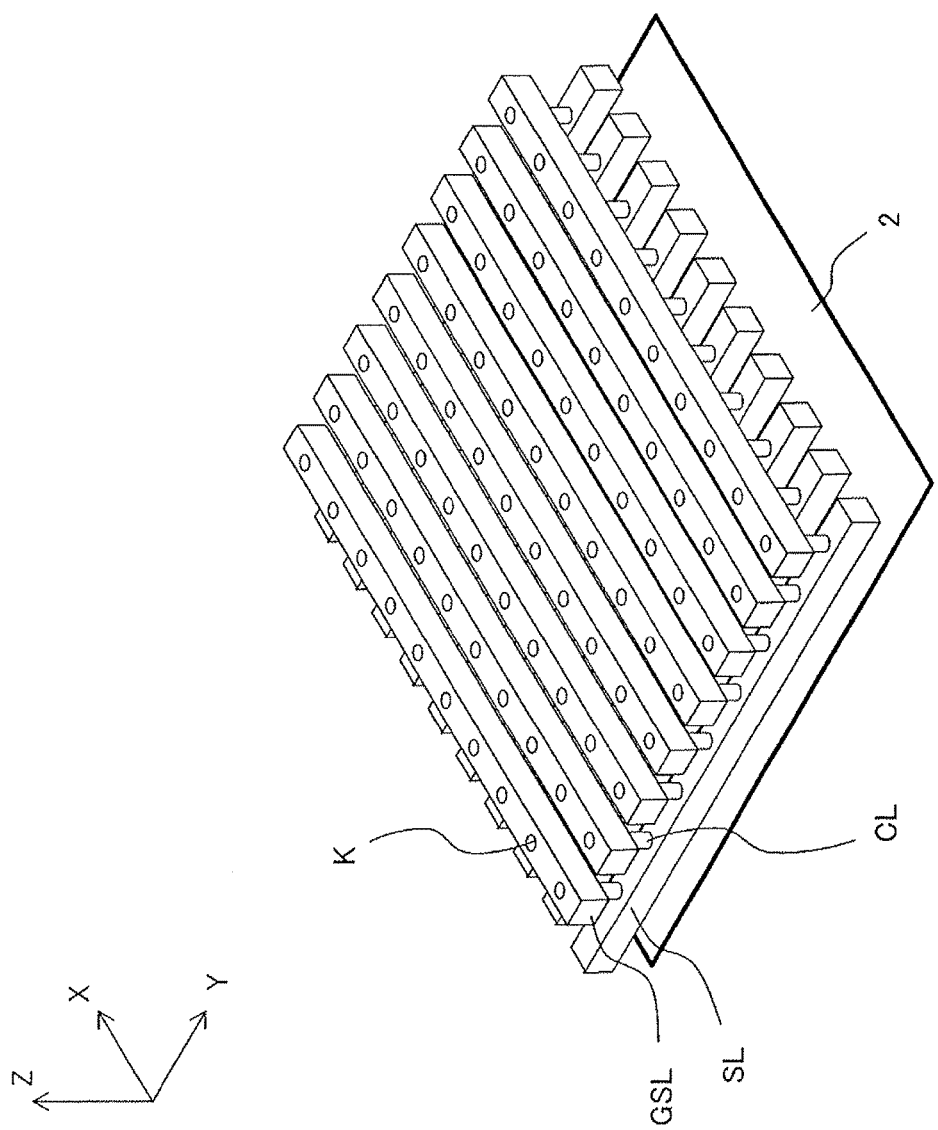
FIG. 5B is a cross-sectional view of one step subsequent to FIG. 5A.

Next, an insulating layer (not illustrated) made of $SiO_2$ is formed all over to cover the plurality of source lines SL. Thereafter, as illustrated in FIG. 5B, the plurality of gate selection lines GSL extending in the X-axis direction and arranged in the Y-axis direction are formed to intersect the plurality of source lines SL. Further, at respective intersections of the plurality of source lines SL and the plurality of gate selection lines GSL that overlap each other in the Z-axis direction, through-holes K are formed that each penetrate the gate selection line GSL and the insulating layer (insulating layer interposed between the source line SL and the gate selection line GSL) immediately therebelow. Each of the through-holes reaches an upper surface of the source line SL. Thereafter, the insulating layer Z1 (see FIG. 3) is formed to cover an inner wall surface of each of the through-holes K, following which the inside of each of the through-holes K is filled with a predetermined electrically-conductive material to form the contact line CL.

Figure 5C:
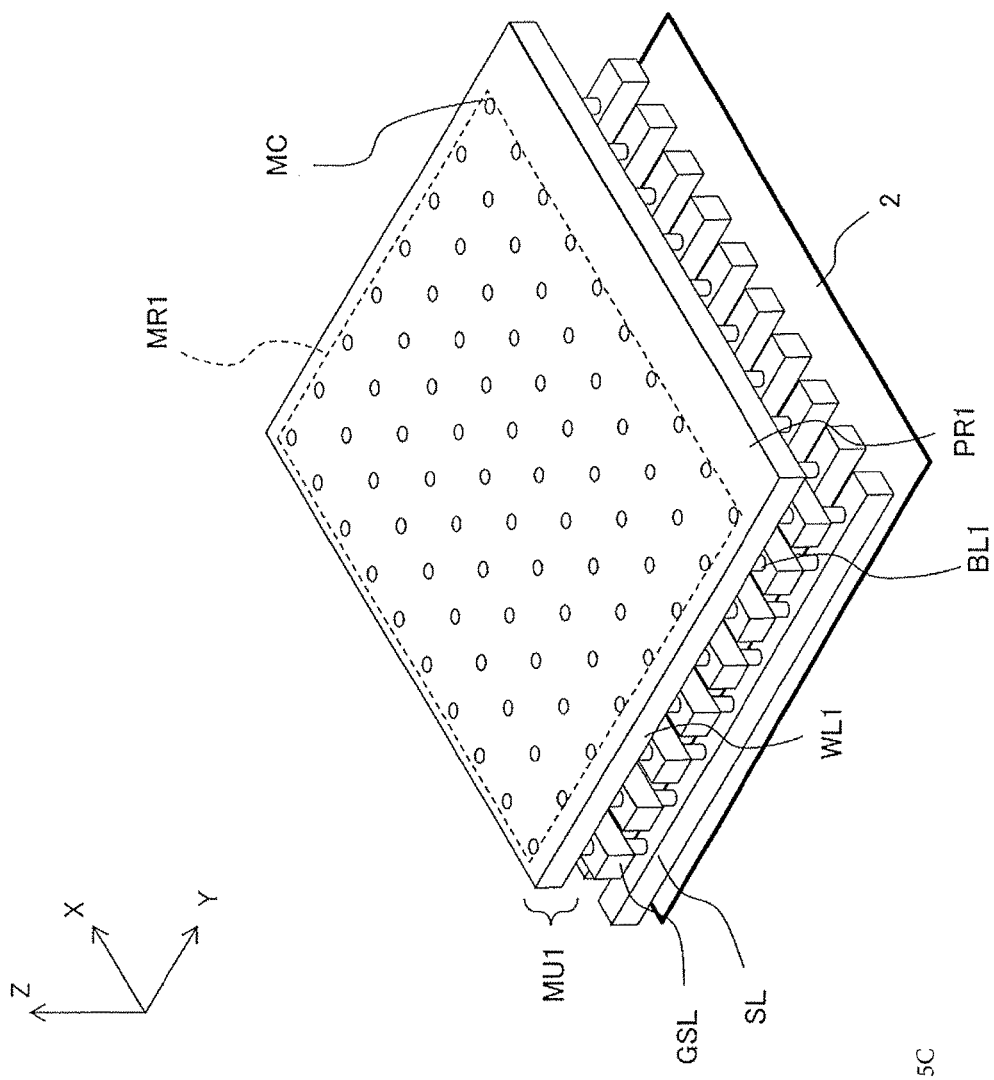
FIG. 5C is a cross-sectional view of one step subsequent to FIG. 5B.

Subsequently, as illustrated in FIG. 5C, the plate-shaped electrode WL1 is formed to cover all the columnar electrodes BL1. In this situation, the plate-shaped electrode WL1 is formed to have such a size that the plate-shaped electrode WL1 includes the peripheral region PR1 on the periphery of the memory cell region MR1 that is to form the plurality of memory cells MC. Further, through-holes (not illustrated) are provided at respective positions, of the plate-shaped electrode WL1, corresponding to a plurality of contact lines CL positioned below. Thereafter, the resistance change element VR is formed to cover the inner wall surface of each of the through-holes, and the inside of each of the through-holes is filled with a predetermined electrically-conductive material, thereby forming the plurality of columnar electrodes BL1 to allow for coupling to the respective contact lines CL (see FIG. 4A). This completes the memory cell unit MU1 in which the plurality of memory cells MC are provided in the memory cell region MR1.

Figure 5D:
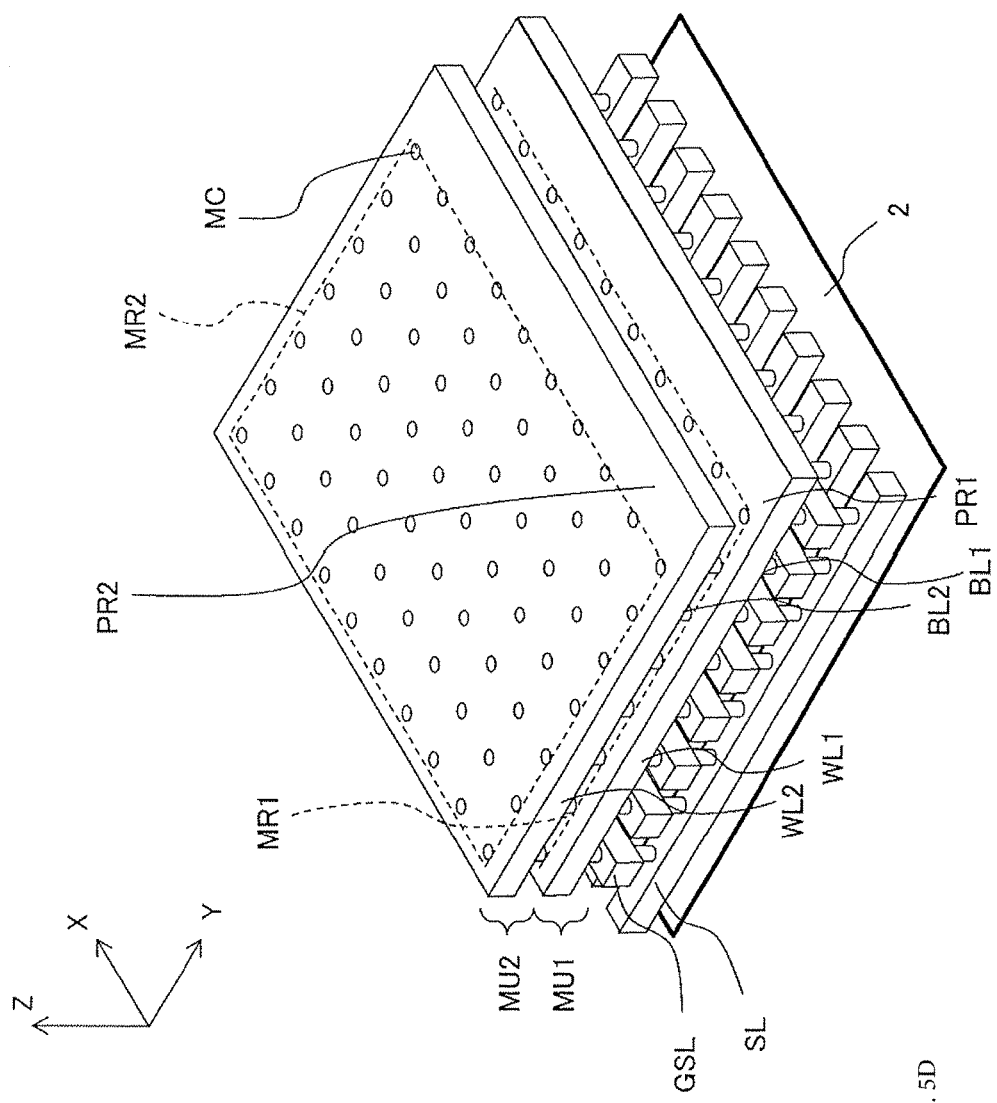
FIG. 5D is a cross-sectional view of one step subsequent to FIG. 5C.

Subsequently, as illustrated in FIG. 5D, the plate-shaped electrode WL2 is formed above the plate-shaped electrode WL1. In this situation, a size of the plate-shaped electrode WL2 in the Y-axis direction is made smaller than a size of the plate-shaped electrode WL1 in the Y-axis direction in order to prevent the plate-shaped electrode WL2 from overlapping the peripheral region PR1. Further, through-holes are provided at respective positions, of the plate-shaped electrode WL2, corresponding to the plurality of columnar electrodes BL1 positioned below. Thereafter, the resistance change element VR is formed to cover the inner wall surface of each of the through-holes, and the inside of each of the through-holes is filled with a predetermined electrically-conductive material, thereby forming the plurality of columnar electrodes BL2 to allow for coupling to the respective columnar electrodes BL1. This completes the memory cell unit MU2 in which the plurality of memory cells MC are provided in the memory cell region MR2.

Figure 5E:
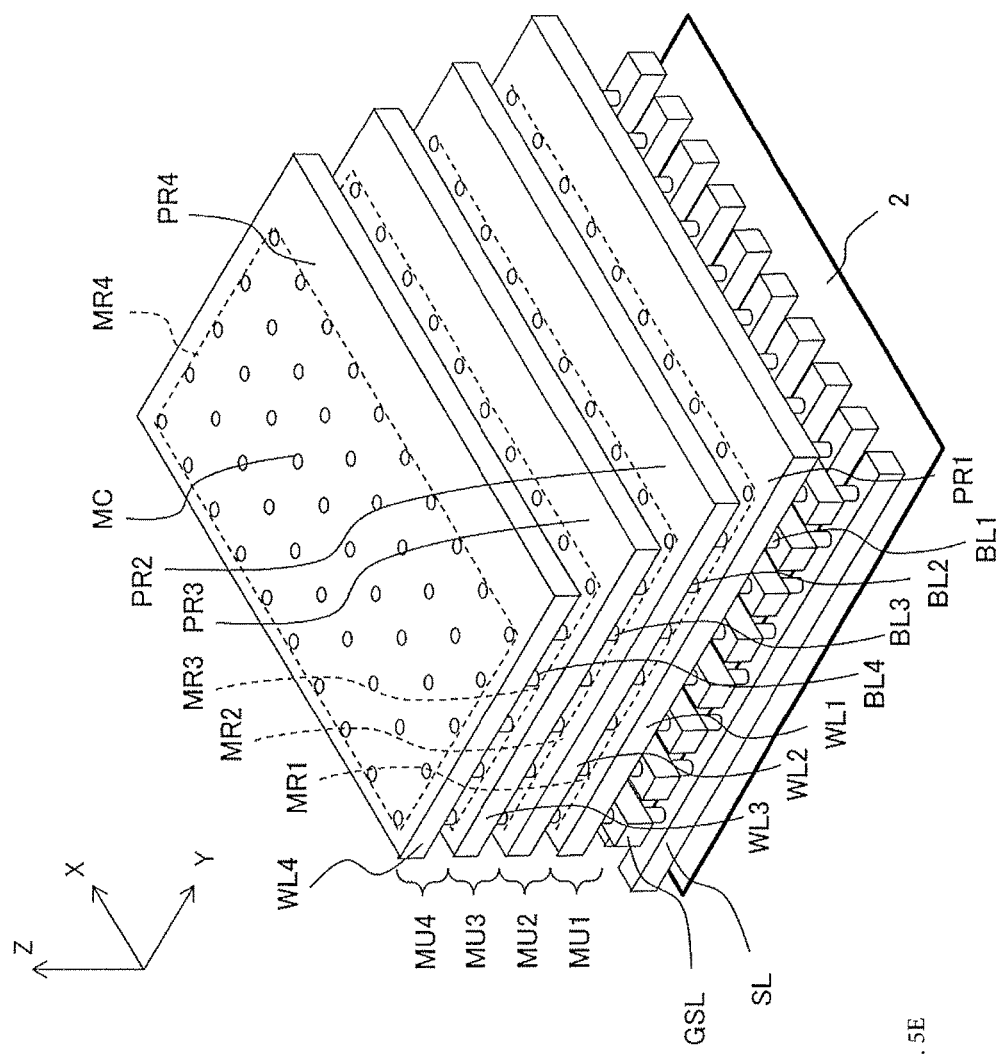
FIG. 5E is a cross-sectional view of one step subsequent to FIG. 5D.

Thereafter, similar operations are repeated to form the memory cell unit MU3 and the memory cell unit MU4 in order, as illustrated in FIG. 5E. In this manner, after the stepwise formation of the plate-shaped electrodes WL1 to WL4, the contact pillars CP1 to CP4 are collectively formed to stand, respectively, in the peripheral regions PR1 to PR4 of the plate-shaped electrodes WL1 to WL4. Further, the beams CB1 to CB4 are collectively formed to be coupled to the upper ends of the contact pillars CP1 to CP4, respectively. This allows the lead lines LL1 to LL4 to be obtained.

This completes the memory device 1.

[Workings and Effects of Memory Device 1]

In the memory device 1, the coupling part 3 in the (m+1)-th memory cell unit MU(m+1) is located at a position where the coupling part 3 and the memory cell region MRm in the m-th memory cell unit Mm overlap each other in the Z-axis direction. In other words, the memory cells MC that form the memory cell unit MUm are also disposed below the peripheral region PR(m+1) where the coupling part 3 is provided in the memory cell unit MU(m+1). This enables the memory device 1 as a whole to utilize a space efficiently and thus to include more memory cells MC in a predetermined space. Thus, it becomes possible to achieve higher integration.

2. Modification Example 1

Figure 6:
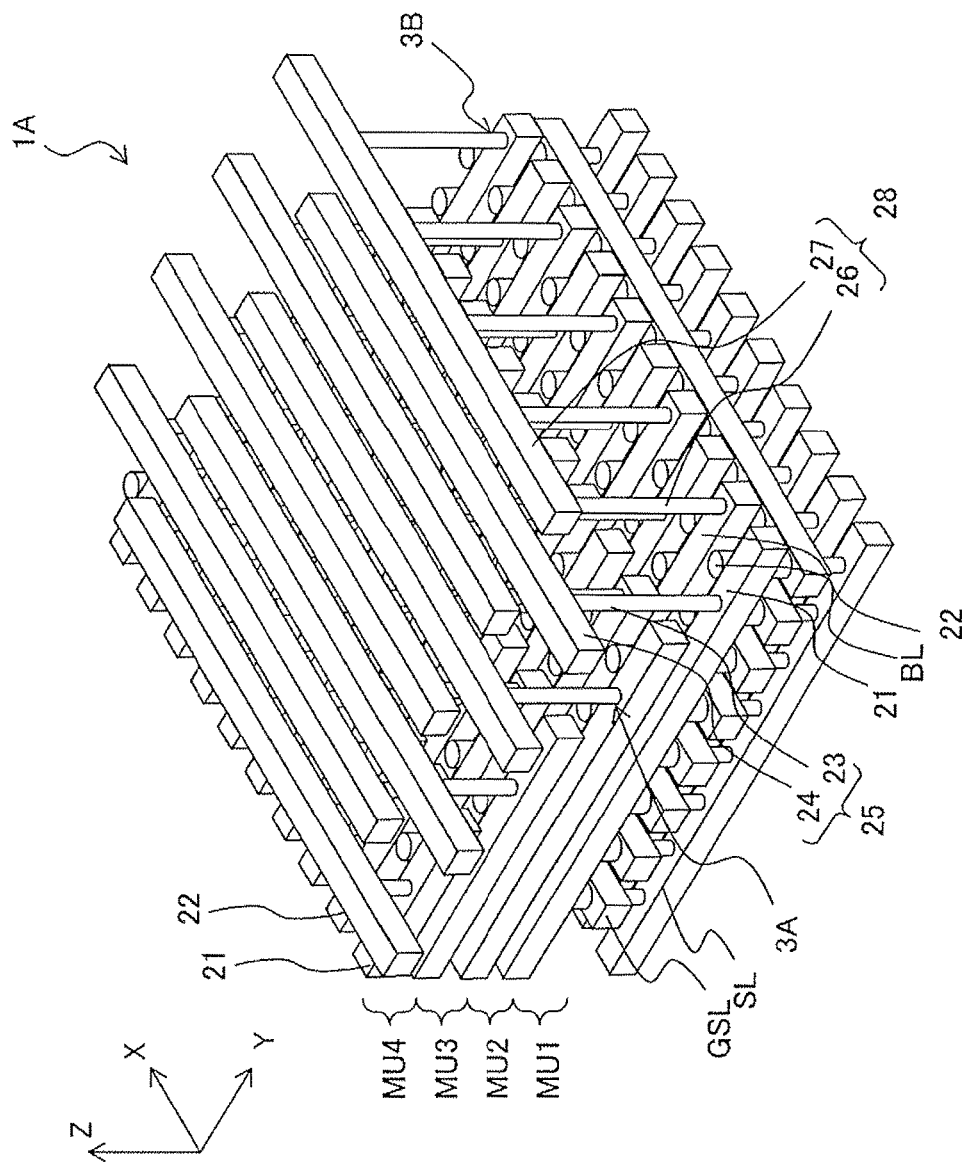
FIG. 6 is a perspective view of a first modification example of the memory device according to the first embodiment of the disclosure.
Figure 7:
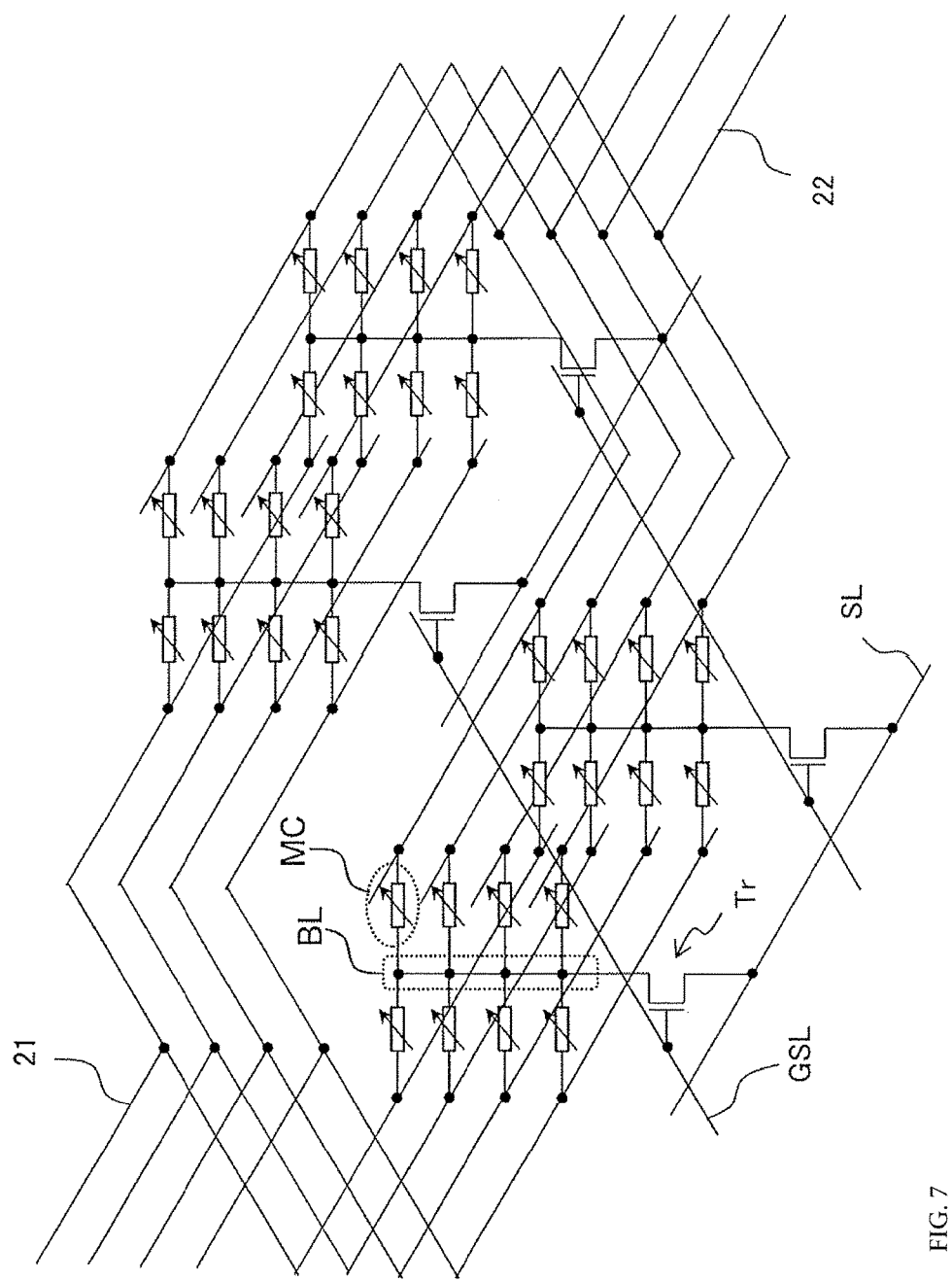
FIG. 7 is an equivalent circuit diagram illustrating a portion of the memory device illustrated in FIG. 6.
Figure 8:
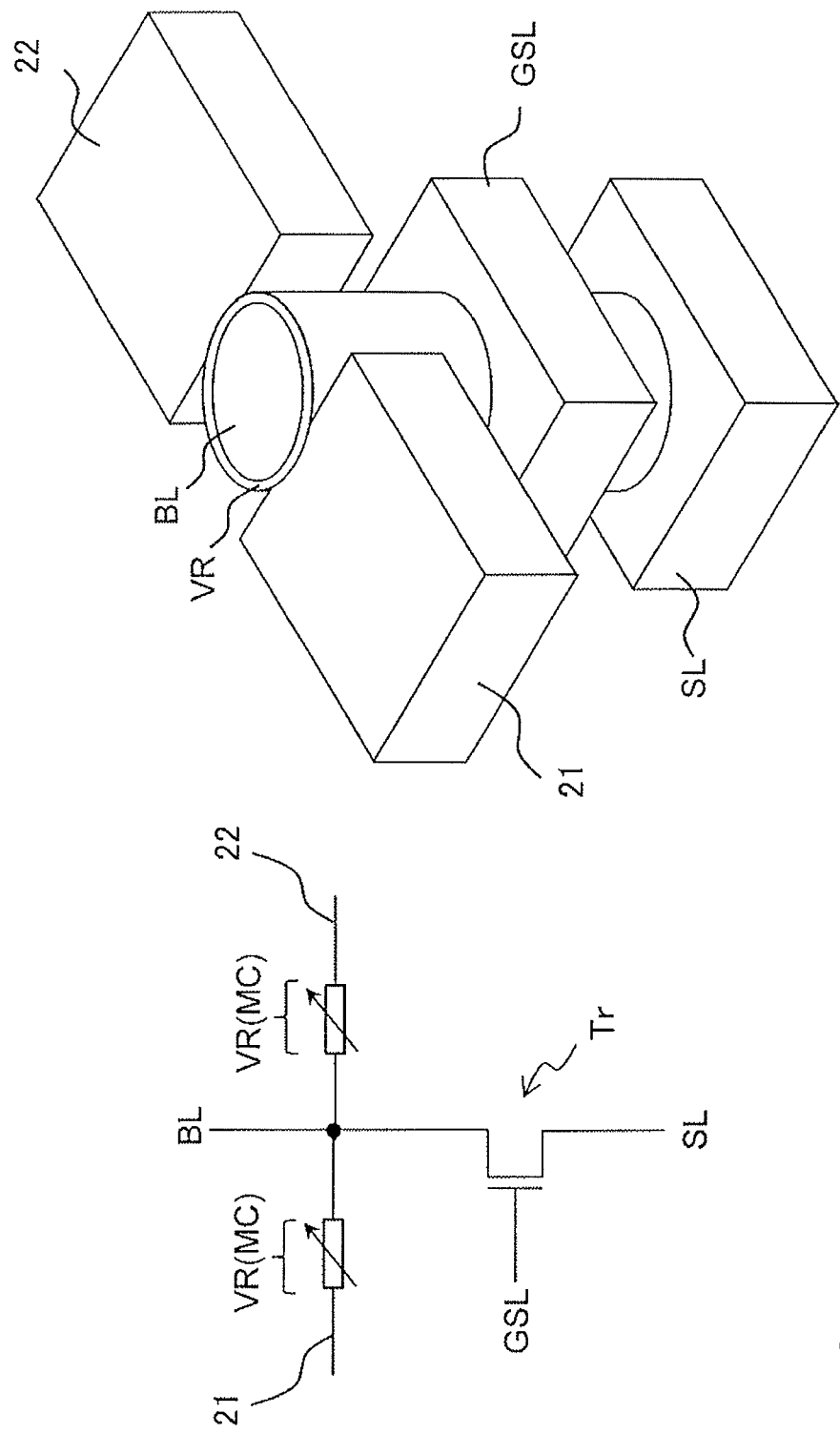
FIG. 8 is an enlarged perspective view of an example of a memory cell to be applied to the memory device illustrated in FIG. 6.

FIG. 6 is a perspective view of an overall configuration example of a memory device 1A according to a second modification example of the foregoing memory device 1. Further, FIG. 7 is an equivalent circuit diagram illustrating a portion of the memory device 1A of FIG. 6. Furthermore, FIG. 8 is an enlarged perspective view of a configuration example of the memory cell MC (right side in the drawing), together with its corresponding equivalent circuit diagram (left side in the drawing).

The memory device 1B includes a plurality of first linear electrodes 21 and a plurality of second linear electrodes 22 instead of the plate-shaped electrodes WL in each of the memory cell units MU1 to MU4. The first linear electrodes 21 and the second linear electrodes 22 each extend in the Y-axis direction, and are arranged alternately in the X-axis direction. Further, columnar electrodes (BL1 to BL4) are each interposed between the first linear electrode 21 and the second linear electrode 22 that are adjacent to each other in the X-axis direction, in each of the memory cell units MU1 to MU4. Furthermore, as illustrated in FIG. 8, the memory cell MC is configured by the resistance change element VR that is interposed between the columnar electrode BL and the first linear electrode 21 and between the columnar electrode BL and the second linear electrode 22. It is to be noted that illustration of the resistance change element VR is omitted in FIG. 6.

Further, as illustrated in FIG. 6, lead lines 25 and 28 are provided instead of the lead line LL. The lead line 25 includes a first contact pillar 23 and a first beam 24. The first contact pillar 23 is coupled to the first linear electrodes 21 to form a first coupling part 3A. The first beam 24 is coupled to an upper end of the first contact pillar 23, and extends in the X-axis direction, for example. In contrast, the lead line 28 includes a second contact pillar 26 and a second beam 27. The second contact pillar 26 is coupled to the second linear electrodes 22 to form a second coupling part 3B. The second beam 27 is coupled to an upper end of the second contact pillar 26, and extends in the X-axis direction, for example. It is to be noted that, in each of the memory cell units MU1 to MU4, a plurality of first contact pillars 23 coupled to the respective first linear electrodes 21 are coupled in common to a single first beam 24. Likewise, in each of the memory cell units MU1 to MU4, a plurality of second contact pillars 26 coupled to the respective second linear electrodes 22 are coupled in common to a single first beam 27.

The memory device 1B includes the plurality of gate selection lines GSL arranged in the Y-axis direction and extending in the X-axis direction; each of the plurality of gate selection lines GSL is coupled to the plurality of columnar electrodes BL arranged in the X-axis direction.

Figure 9:
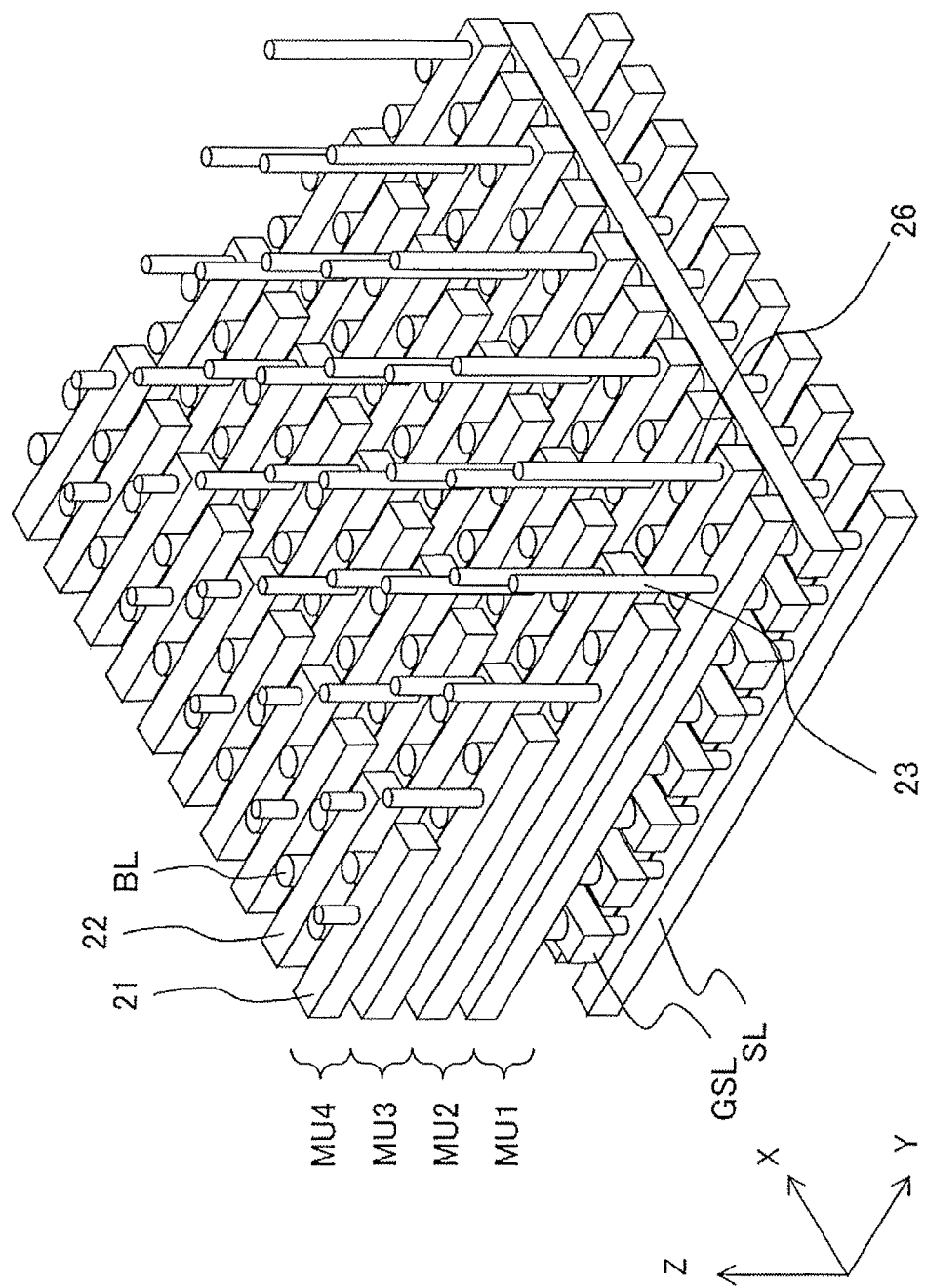
FIG. 9 is a perspective view of a portion of the memory device illustrated in FIG. 6.

FIG. 9 illustrates a configuration of a main part of the memory device 1B in which the first beam 24 and the second beam 27 are omitted. As illustrated in FIG. 9, the first linear electrodes 21 and the second linear electrodes 22 are each disposed stepwise. That is, a size of the first linear electrode 21 in the (m+1)-th memory cell unit MU(m+1) in the Y-axis direction is shorter than a size of the first linear electrode 21 in the m-th memory cell unit MUm in the Y-axis direction. Likewise, a size of the second linear electrode 22 in the memory cell unit MU(m+1) in the Y-axis direction is shorter than a size of the second linear electrode 22 in the memory cell unit MUm in the Y-axis direction. Such a configuration allows a region where the plurality of first contact pillars 23 and the plurality of second contact pillars 26 stand and the memory cell region where the memory cells MC are provided to overlap each other in the Z-axis direction. Thus, it becomes possible to achieve higher integration also in the memory device 1A, similarly to the memory device 1 of the foregoing first embodiment.

3. Modification Example 2

Figure 10:
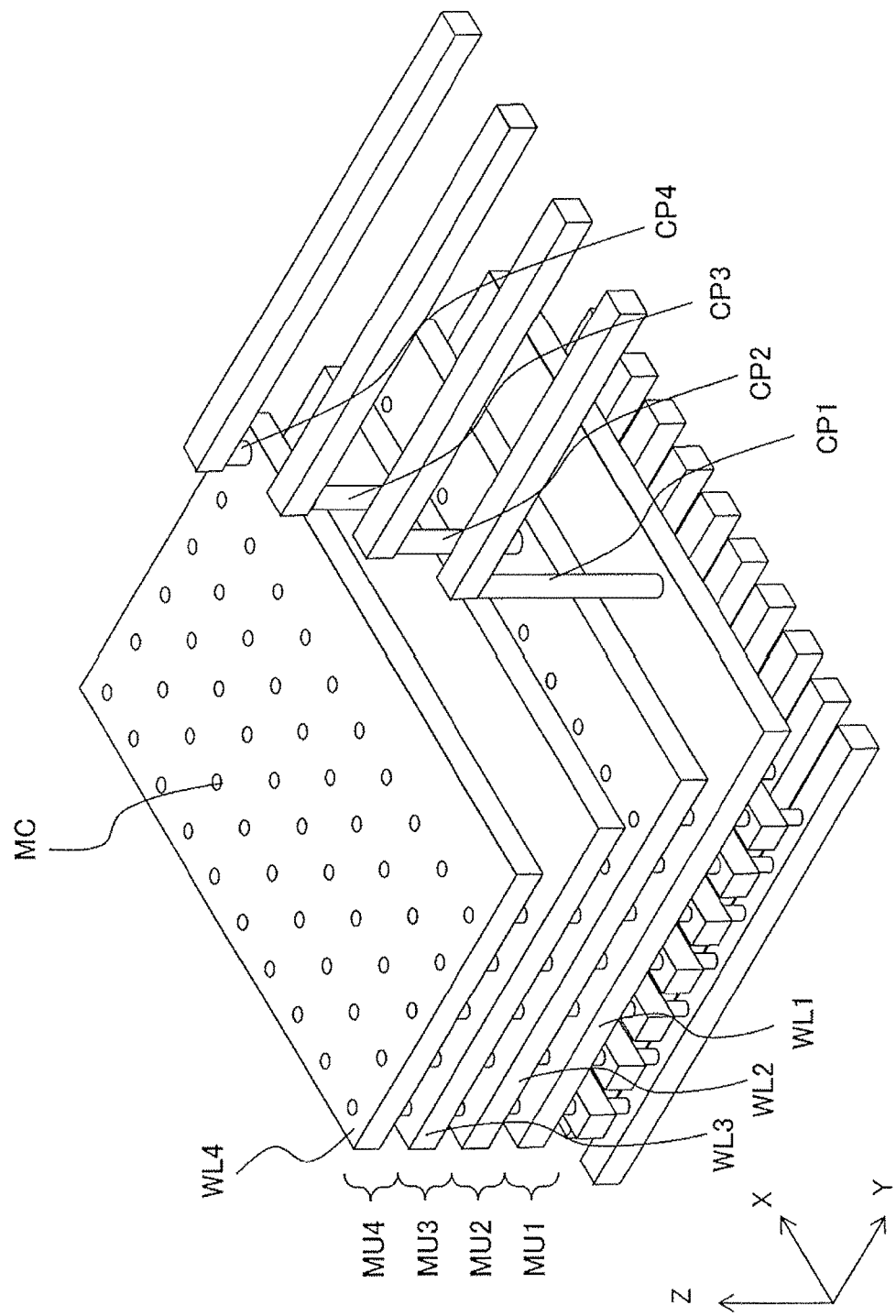
FIG. 10 is a perspective view of a second modification example of the memory device according to the first embodiment of the disclosure.

FIG. 10 is a perspective view of an overall configuration example of a memory device 1B that is a second modification example of the above-described memory device 1. In the memory device 1 of the foregoing first embodiment, every time a single plate-shaped electrode WL is stacked, the through-holes are opened in the plate-shaped electrode WL to perform formation of the memory cells MC and the columnar electrodes BL. In contrast, as in the present modification example, formation of common through-holes may be performed for the plurality of plate-shaped electrodes WL after the plurality of plate-shaped electrodes WL are stacked, in order to further simplify the manufacturing process. In this case, it is possible to perform collective formation of the memory cells MC and the columnar electrodes BL throughout the plurality of the memory cell units MU. In FIG. 10, two plate-shaped electrodes WL are stacked, and thereafter the collection formation of the through-holes are performed for the two plate-shaped electrodes WL, following which the formation of the memory cells MC and the columnar electrodes BL are further performed to fill the through-holes. It is to be noted that the formation of the common through-holes may be performed for plate-shaped electrodes WL of three layers or more.

4. Second Embodiment

[Configuration of Memory Device 1B]

Figure 11:
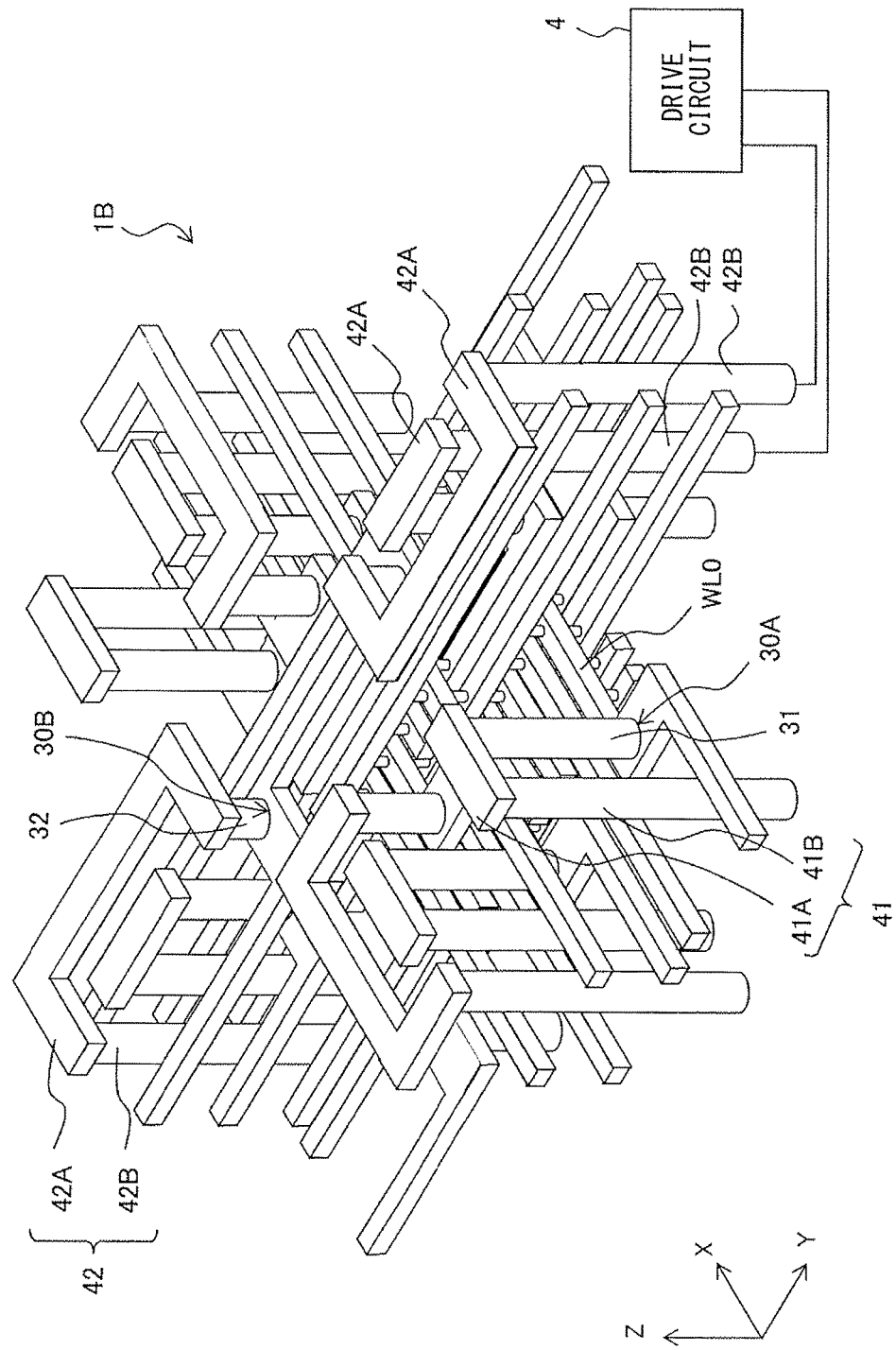
FIG. 11 is a perspective view of an overall configuration example of a memory device according to a second embodiment of the disclosure.
Figure 12:
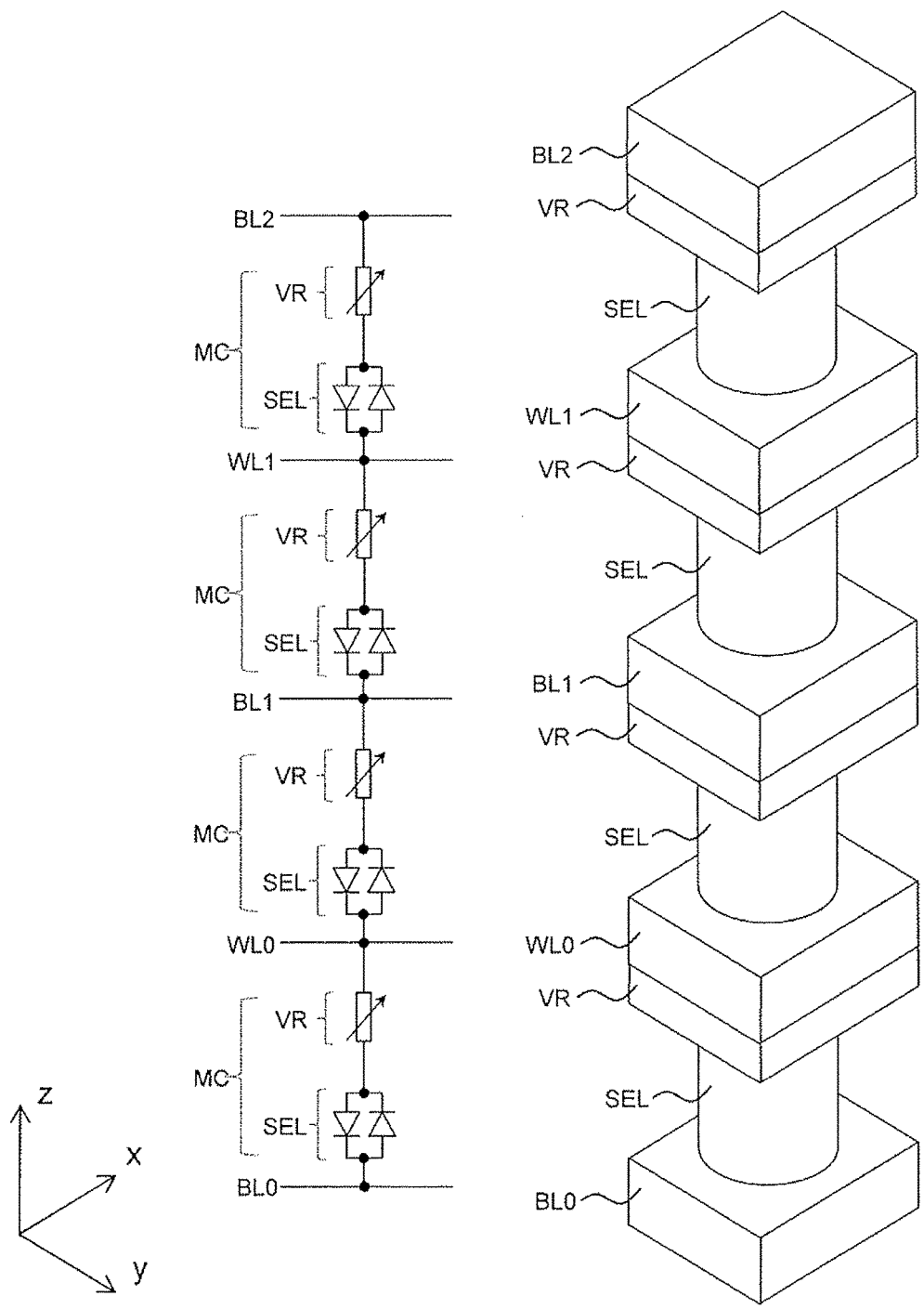
FIG. 12 is an enlarged perspective view of a memory cell to be applied to the memory device illustrated in FIG. 11, together with its equivalent circuit diagram.

FIG. 11 is a perspective view of an overall configuration example of a memory device 1B as a second embodiment of the disclosure. FIG. 12 is an enlarged perspective view of a vicinity of the memory cell MC to be applied to the memory device 1B illustrated in FIG. 11, together with its equivalent circuit diagram. Further, FIG. 13 is a schematic cross-sectional view of a main part of the memory device 1B.

Figure 13:
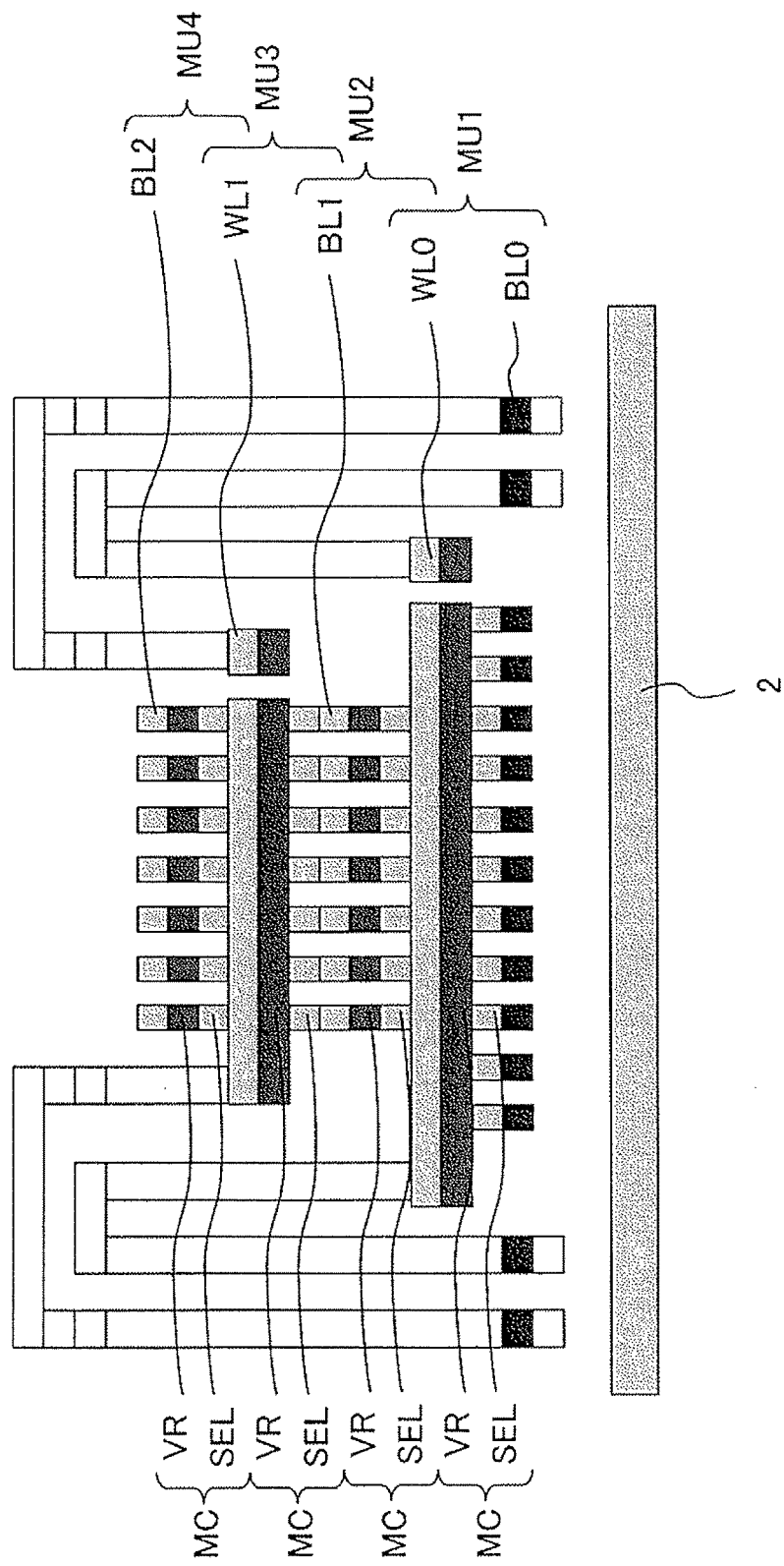
FIG. 13 is a schematic cross-sectional view of a main part of the memory device illustrated in FIG. 11.

As illustrated in FIGS. 11 to 13, in the memory device 1B, a plurality of bit lines BL, the plurality of memory cells MC, and a plurality of word lines WL are stacked in order from side of the substrate 2 (illustrated only in FIG. 13) in the Z-axis direction. More specifically, a bit line BL0, the memory cell MC, a word line WL0, the memory cell MC, a bit line BL1, the memory cell MC, a word line WL1, the memory cell MC, a bit line BL2, . . . are stacked in order over the substrate 2. The memory cell MC has a stacked structure in which the selection element SEL and the resistance change element VR are stacked in order from side of the substrate 2. Further, the resistance change element VR has substantially the same planar shape as that of the word line WL or the bit line BL immediately above the resistance change element VR.

The plurality of word lines WL each extend in substantially the X-axis direction, and are disposed to be arranged in the Y-axis direction. The plurality of bit lines BL each extend in substantially the Y-axis direction, and are disposed to be arranged in the X-axis direction. A plurality of selection elements SEL are disposed to be arranged in both of the X-axis direction and the Y-axis direction. One resistance change element VR is provided in common for the plurality of selection elements SEL arranged in the X-axis direction, or is provided in common for the plurality of selection elements SEL arranged in the Y-axis direction.

Also in the present embodiment, the (m+1)-th memory cell region MR(m+1) surrounded by the plurality of memory cells MC in the (m+1)-th memory cell unit is narrower than the m-th memory cell region MRm. Further, as the lead line, there are provided a first contact pillar 31 and a second contact pillar 32. The first contact pillar 31 is coupled to the word line WL to form a first coupling part 30A as the coupling part, and extends to be away from the substrate 2. The second contact pillar 32 is coupled to the bit line BL to form a second coupling part 30B as the coupling part, and extends to be away from the substrate 2.

An upper end of the first contact pillar 31 is coupled to the drive circuit 4 through a wiring line 41 that includes a beam 41A and a pillar 41B. Further, an upper end of the second contact pillar 32 is coupled to the drive circuit 4 through a wiring line 42 that includes a beam 42A and a pillar 42B.

[Manufacturing Method of Memory Device 1B]

The memory device 1B is able to be manufactured as follows, for example.

Figure 14A:
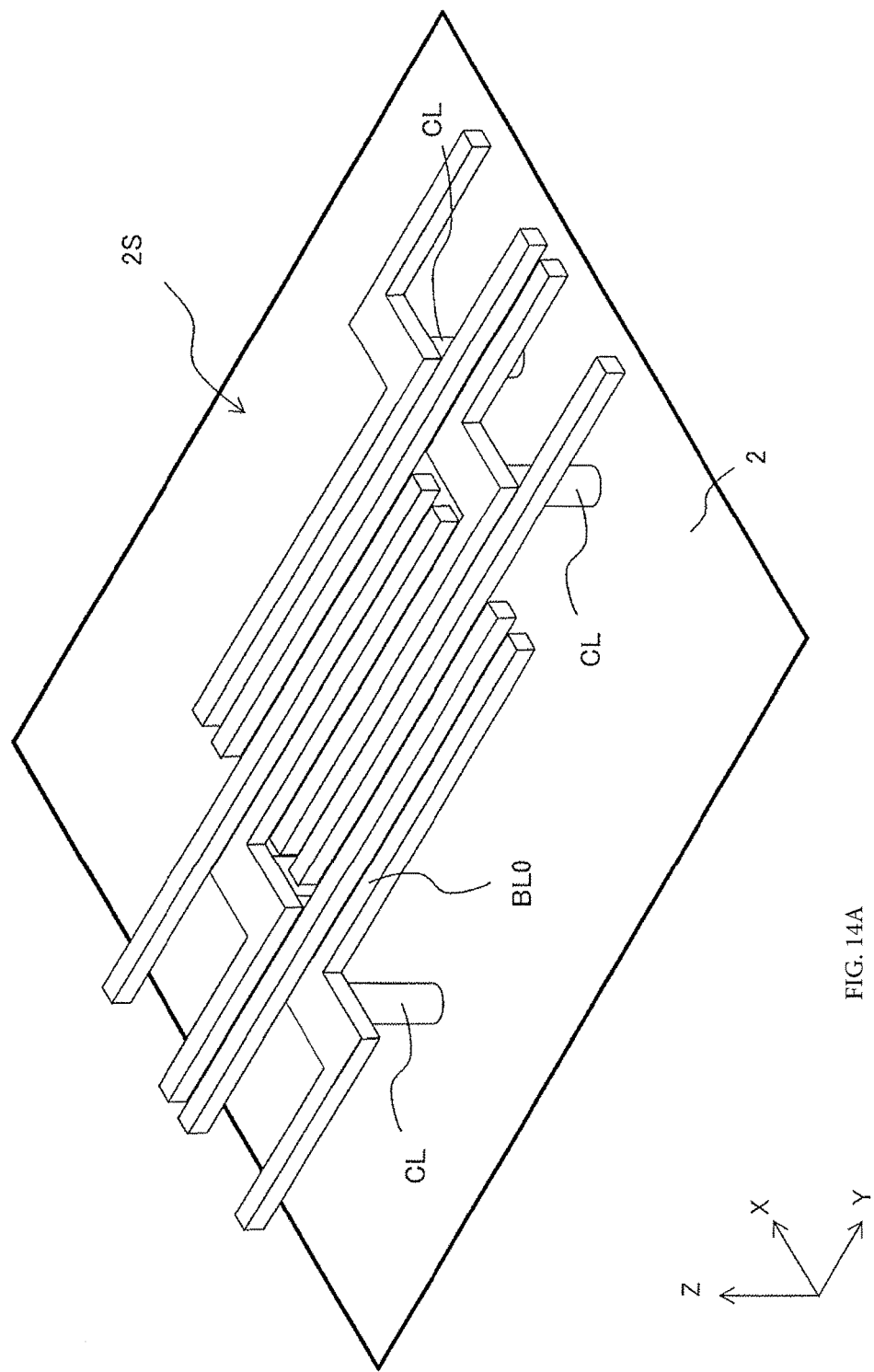
FIG. 14A is a perspective view of one step in a manufacturing method of the memory device illustrated in FIG. 11.

FIGS. 14A to 14L illustrate a portion of a manufacturing method of the memory device 1B in order of steps. First, as illustrated in FIG. 14A, the substrate 2 having a principal surface 2S along the X-Y plane is prepared, and the drive circuit 4 (not illustrated here) is formed on the principal surface 2S. Thereafter, the plurality of contact lines CL stand on the substrate 2, following which a plurality of bit lines BL0 extending in the Y-axis direction are formed to be arranged in the X-axis direction to be coupled to the contact lines CL.

Figure 14B:
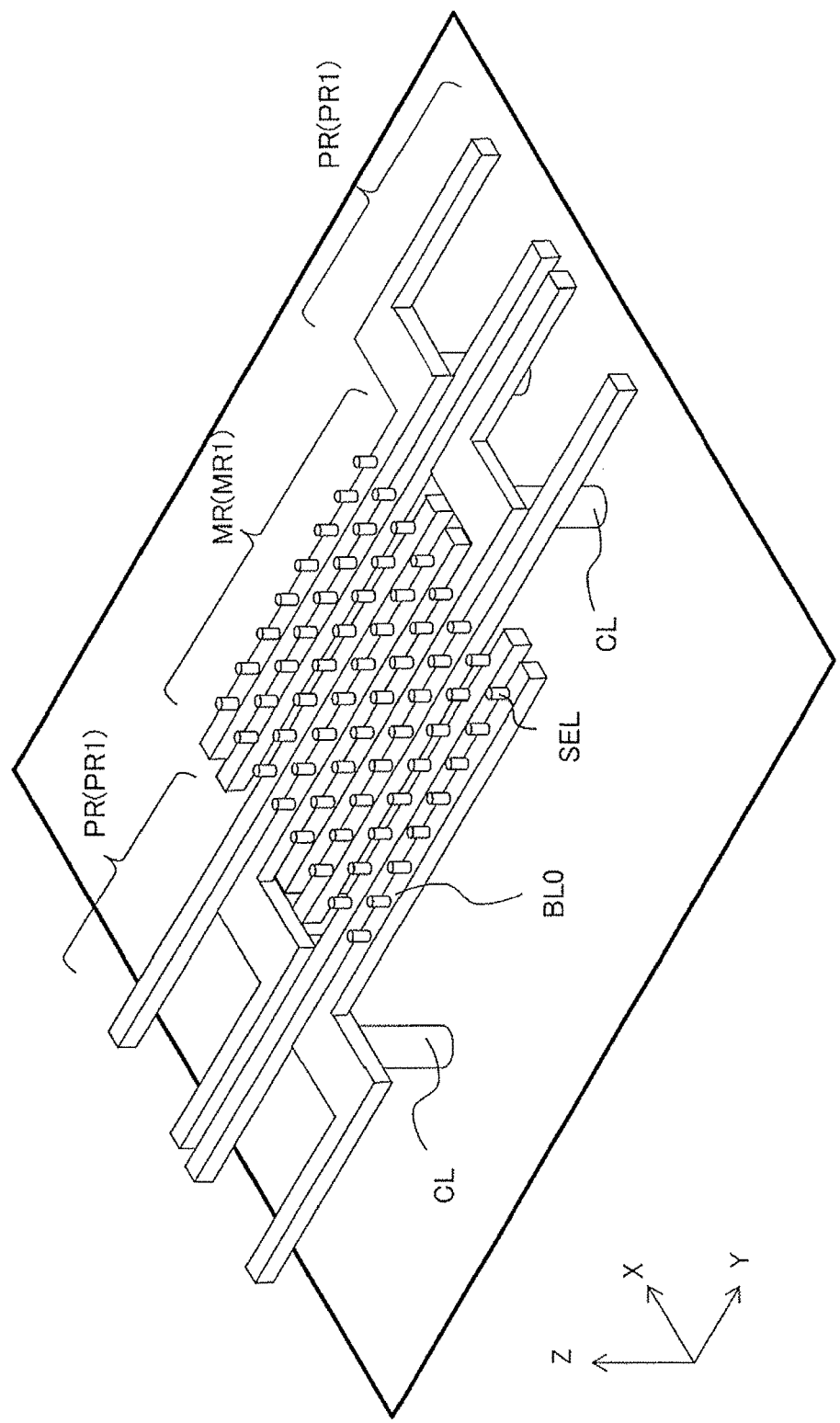
FIG. 14B is a cross-sectional view of one step subsequent to FIG. 14A.

Next, as illustrated in FIG. 14B, the plurality of selection elements SEL are formed into matrix as a whole in the memory cell region MR (MR1). Here, the plurality of selection elements SEL stand to be arranged at equal intervals, for example, in the Y-axis direction for one bit line BL0. Both adjacent regions extended from the memory cell region MR along the Y-axis direction are each referred to as the peripheral region (or contact region) PR (PR1). In the peripheral region PR, a portion of the bit line BL0 has a bent part having a larger width. This is aimed at allowing for disposition of the contact line CL having a larger diameter than a width of the bit line BL0. It is to be noted that the bit line BL0 ends midway in FIGS. 14A to 14L, but is coupled to another memory cell block MB (described later) disposed adjacently. Basically, one contact line CL drives respective bit lines BL0 in two memory cell units. This is why the contact lines are disposed only for four bit lines BL0 among eight bit lines BL0, although the eight bit lines BL0 are drawn in FIG. 14A, for example. The remaining four bit lines BL0 where the contact line CL is not disposed are each coupled to the bit line BL0 that extends from the adjacent memory cell block MB, and are driven.

Figure 14C:
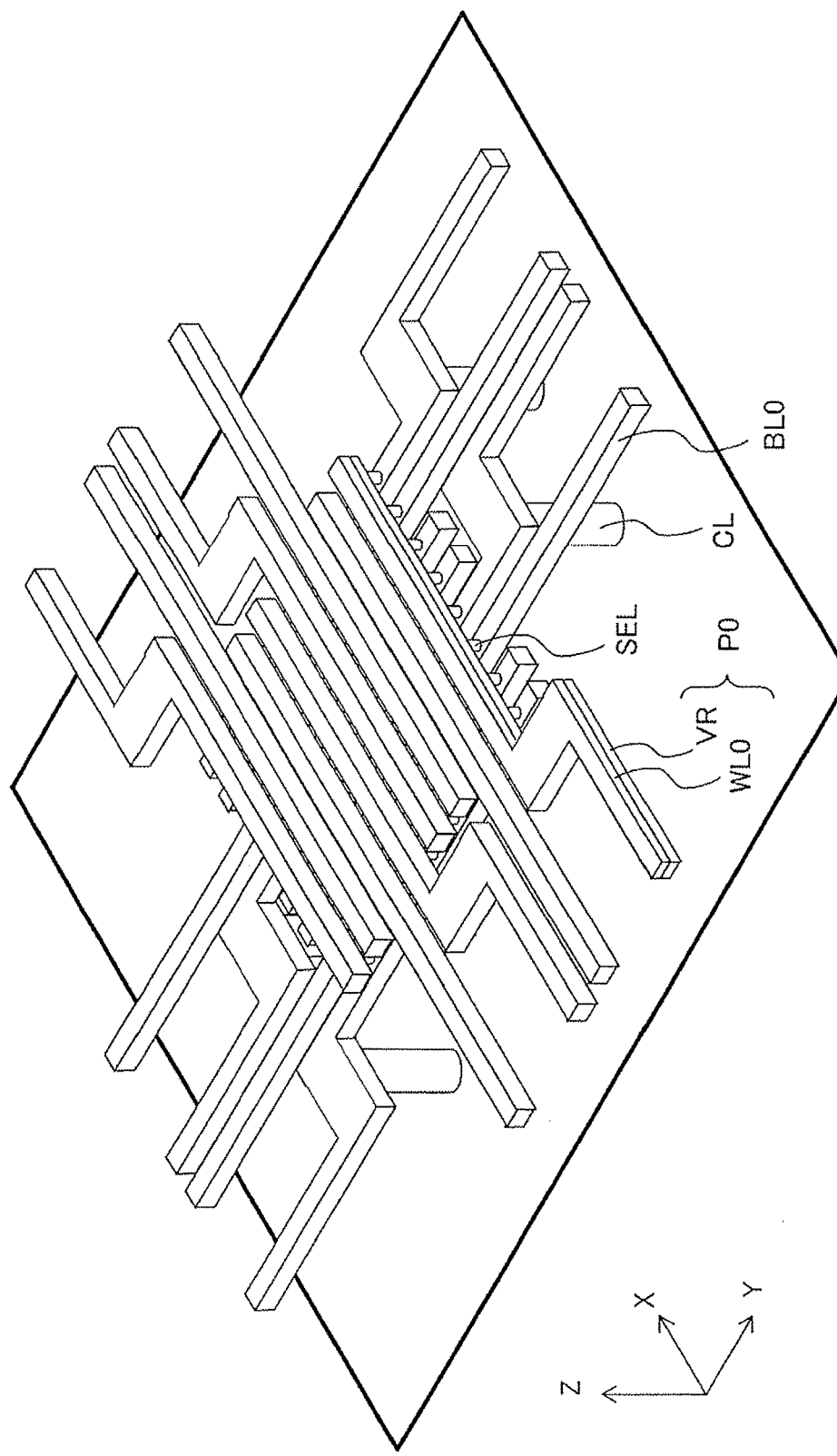
FIG. 14C is a cross-sectional view of one step subsequent to FIG. 14B.

Next, as illustrated in FIG. 14C, as an upper layer of the selection elements SEL, the resistance change element VR and the word line WL0 are stacked in order all over, and thereafter are patterned collectively to have a plurality of (eight as an example in FIG. 14C) linear patterns extending in substantially the X-axis direction. In this situation, a stacked pattern P0 extending in the X-axis direction is coupled in common to the plurality of selection elements SEL arranged in the X-axis direction. The stacked pattern P0 is a stacked structure of the resistance change element VR and the word line WL0. It is to be noted that, in FIG. 14C, only one of eight stacked patterns P0 is drawn to have the stacked structure of the resistance change element VR and the word line WL0; however, each of other stacked patterns P0 also has a similar structure.

Figure 14D:
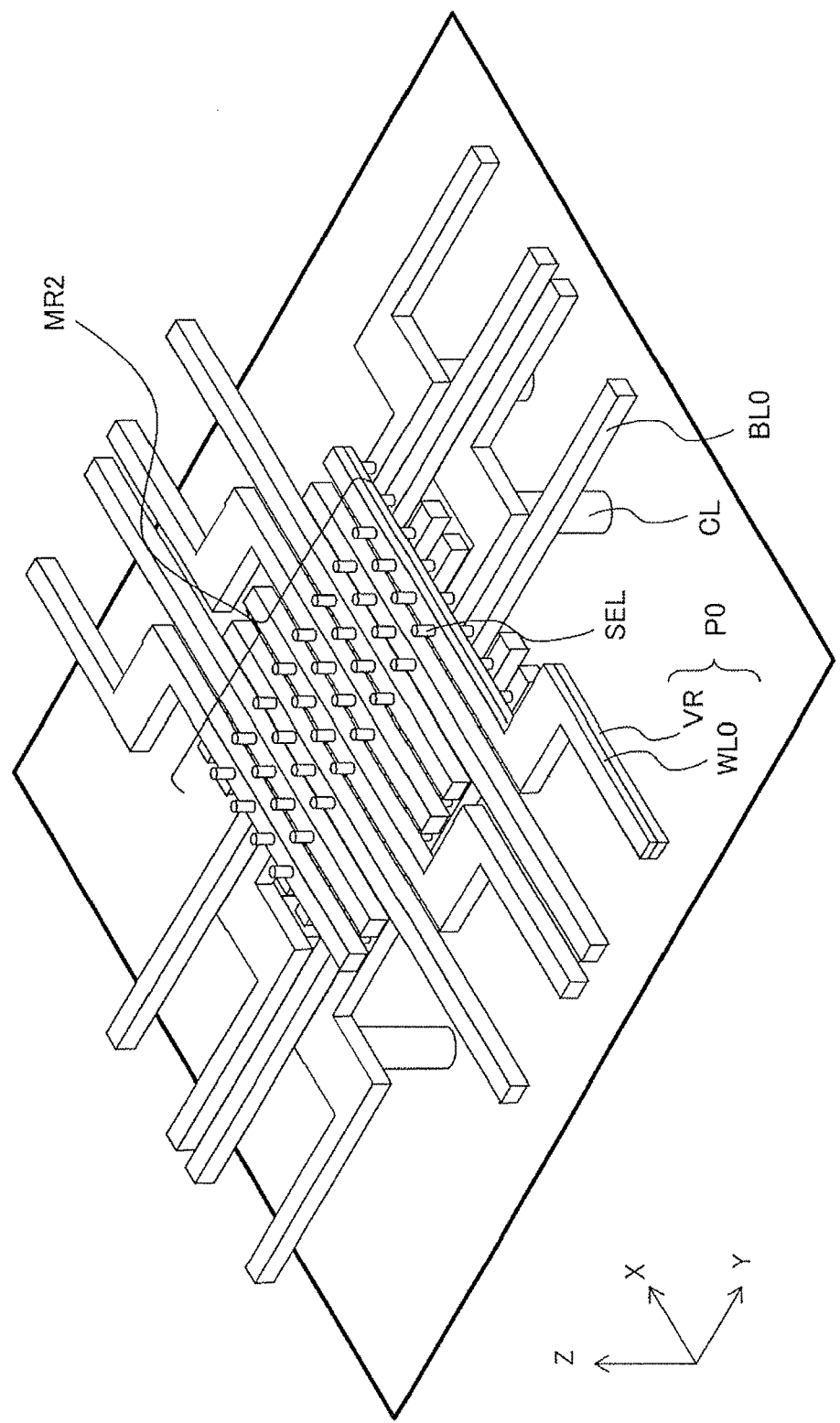
FIG. 14D is a cross-sectional view of one step subsequent to FIG. 14C.

Next, as illustrated in FIG. 14D, the plurality of selection elements SEL are provided in matrix on each of the stacked patterns P0. FIG. 14D illustrates an example in which four selection elements SEL are disposed on each of the stacked patterns P0. The memory cell region MR2 in this situation is narrower than the memory cell region MR1 (FIG. 14B).

Figure 14E:
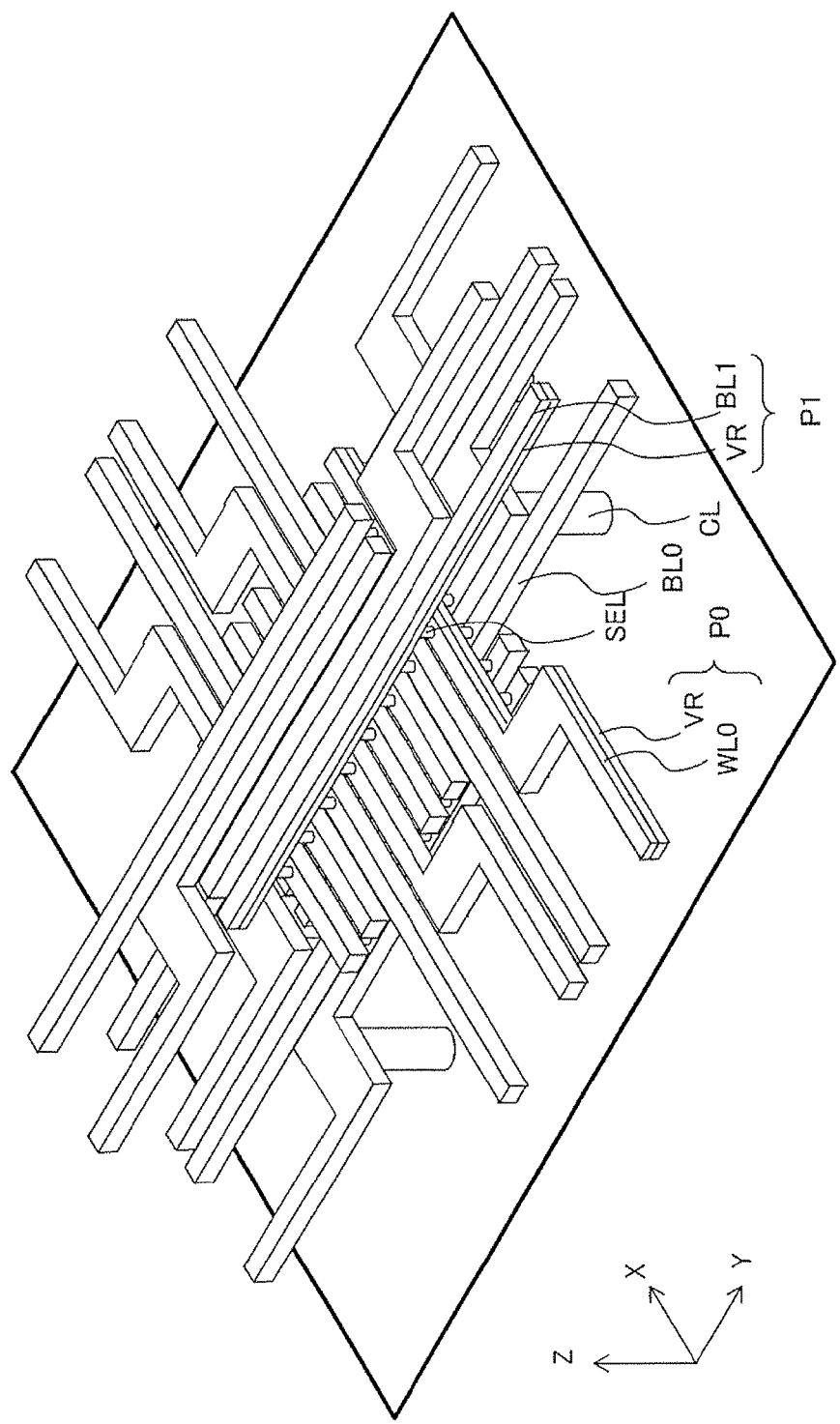
FIG. 14E is a cross-sectional view of one step subsequent to FIG. 14D.

Next, as illustrated in FIG. 14E, as an upper layer of the selection elements SEL, the resistance change element VR and the bit line BL1 are stacked in order all over, and thereafter are patterned collectively to have a plurality of (four as an example in FIG. 14E) linear patterns extending in substantially the Y-axis direction. In this situation, a stacked pattern P1 extending in the Y-axis direction is coupled in common to the plurality of selection elements SEL arranged in the Y-axis direction. The stacked pattern P1 is a stacked structure of the resistance change element VR and the bit line BL1. It is to be noted that, in FIG. 14E, only one of four stacked patterns P1 is drawn to have the stacked structure of the resistance change element VR and the bit line BL1; however, each of other stacked patterns P1 also has a similar structure.

Figure 14F:
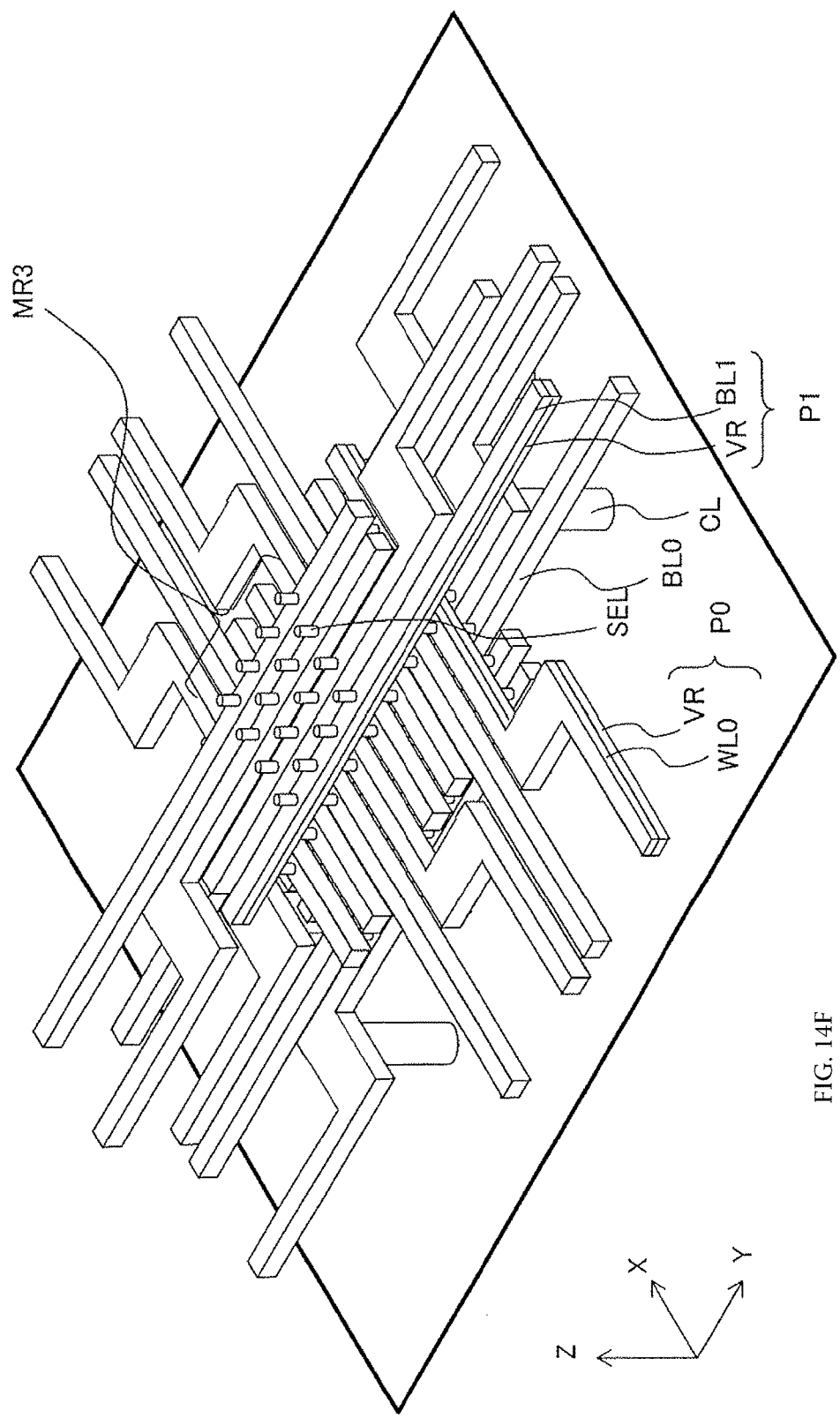
FIG. 14F is a cross-sectional view of one step subsequent to FIG. 14E.

Next, as illustrated in FIG. 14F, the plurality of selection elements SEL are provided in matrix on each of the stacked patterns P1. FIG. 14F illustrates an example in which four selection elements SEL are disposed on each of the stacked patterns P1. The memory cell region MR3 in this situation is still narrower than the memory cell region MR2 (FIG. 14D).

Figure 14G:
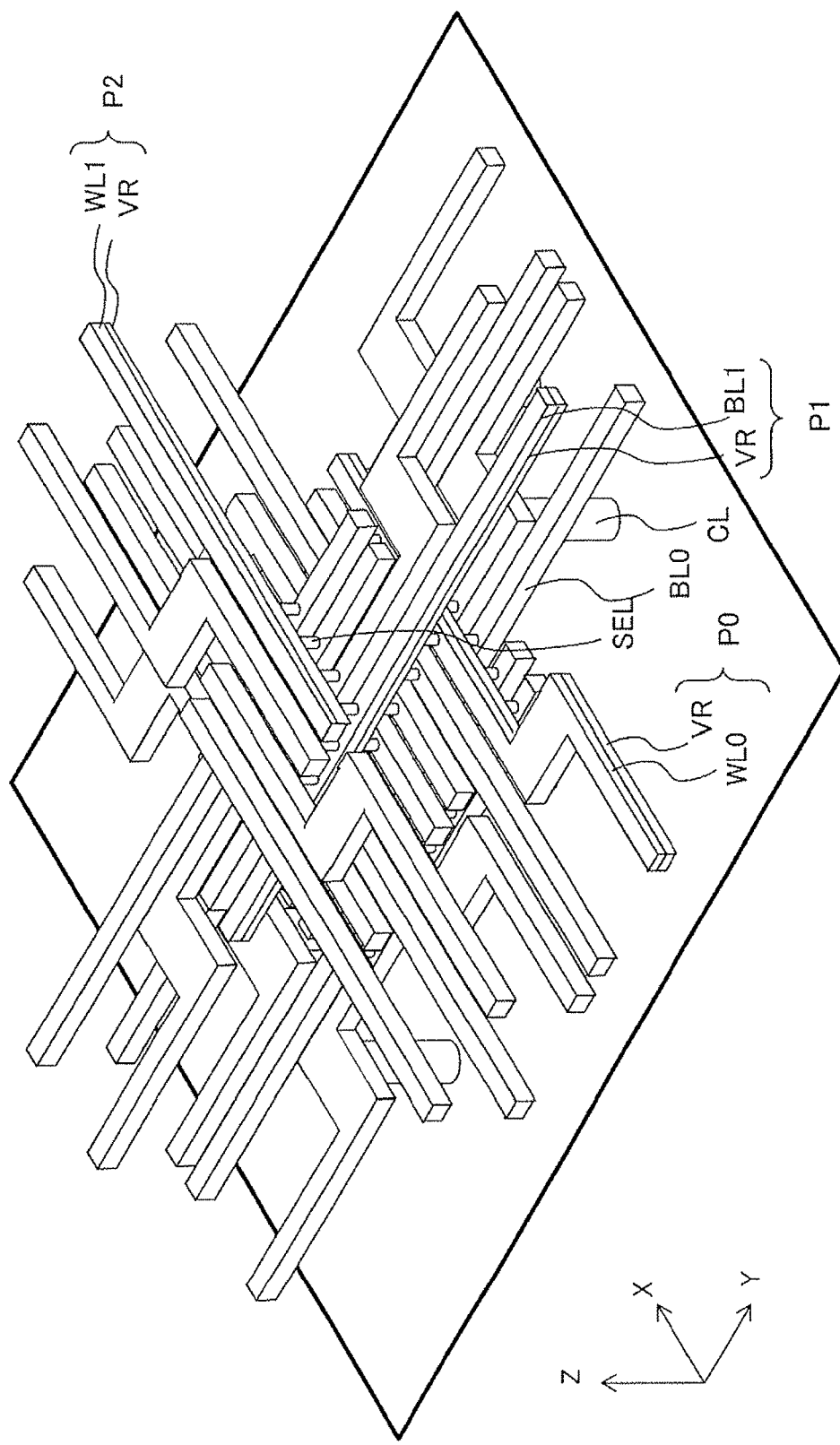
FIG. 14G is a cross-sectional view of one step subsequent to FIG. 14F.

Next, as illustrated in FIG. 14G, as an upper layer of the selection elements SEL, the resistance change element VR and the word line WL1 are stacked in order all over, and thereafter are patterned collectively to have a plurality of (four as an example in FIG. 14G) linear patterns extending in substantially the X-axis direction. In this situation, a stacked pattern P2 extending in the X-axis direction is coupled in common to the plurality of selection elements SEL arranged in the X-axis direction. The stacked pattern P2 is a stacked structure of the resistance change element VR and the word line WL1. It is to be noted that, in FIG. 14G, only one of four stacked patterns P2 is drawn to have the stacked structure of the resistance change element VR and the word line WL1; however, each of other stacked patterns P2 also has a similar structure.

Figure 14H:
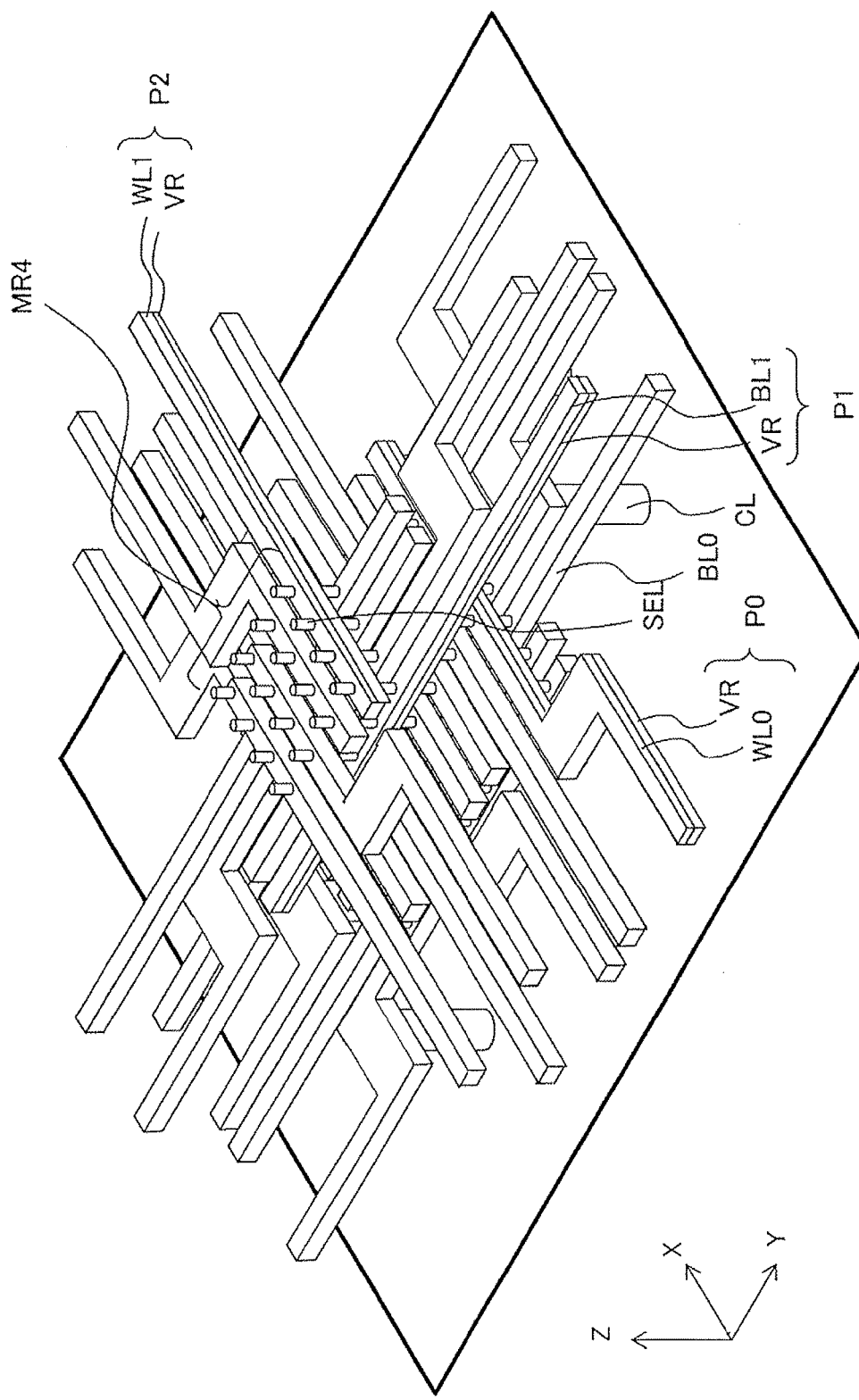
FIG. 14H is a cross-sectional view of one step subsequent to FIG. 14G.

Next, as illustrated in FIG. 14H, the plurality of selection elements SEL are provided in matrix on each of the stacked patterns P2. FIG. 14H illustrates an example in which four selection elements SEL are disposed on each of the stacked patterns P2. The memory cell region MR4 in this situation is equivalent to the memory cell region MR3 (FIG. 14F).

Figure 14J:
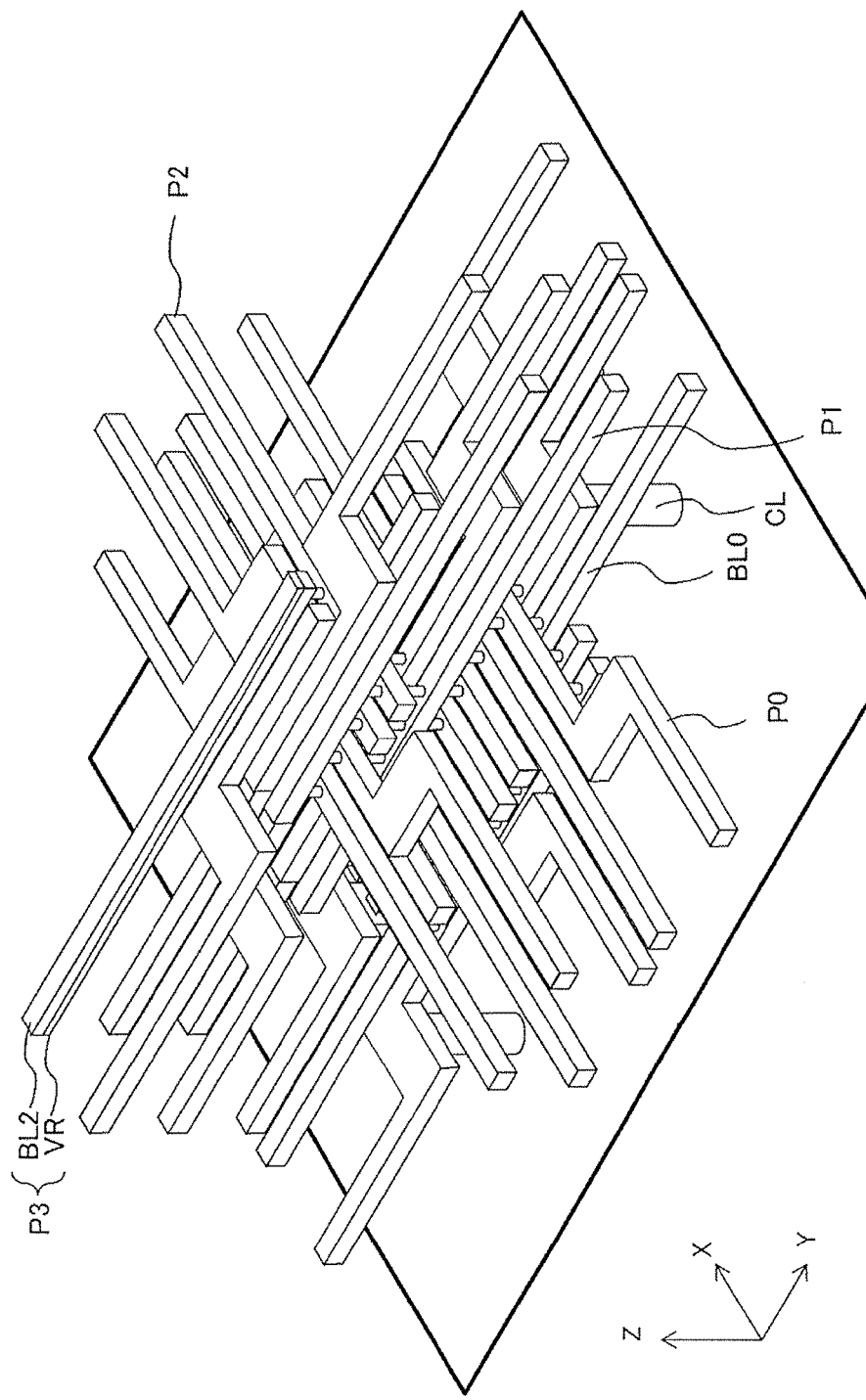
FIG. 14J is a cross-sectional view of one step subsequent to FIG. 14H.

Next, as illustrated in FIG. 14J, as an upper layer of the selection elements SEL, the resistance change element VR and the bit line BL2 are stacked in order all over, and thereafter are patterned collectively to have a plurality of (four as an example in FIG. 14J) linear patterns extending in substantially the Y-axis direction. In this situation, a stacked pattern P3 extending in the X-axis direction is coupled in common to the plurality of selection elements SEL arranged in the Y-axis direction. The stacked pattern P3 is a stacked structure of the resistance change element VR and the bit line BL2. It is to be noted that, in FIG. 14J, only one of four stacked patterns P3 is drawn to have the stacked structure of the resistance change element VR and the bit line BL2; however, each of other stacked patterns P3 also has a similar structure.

Figure 14K:
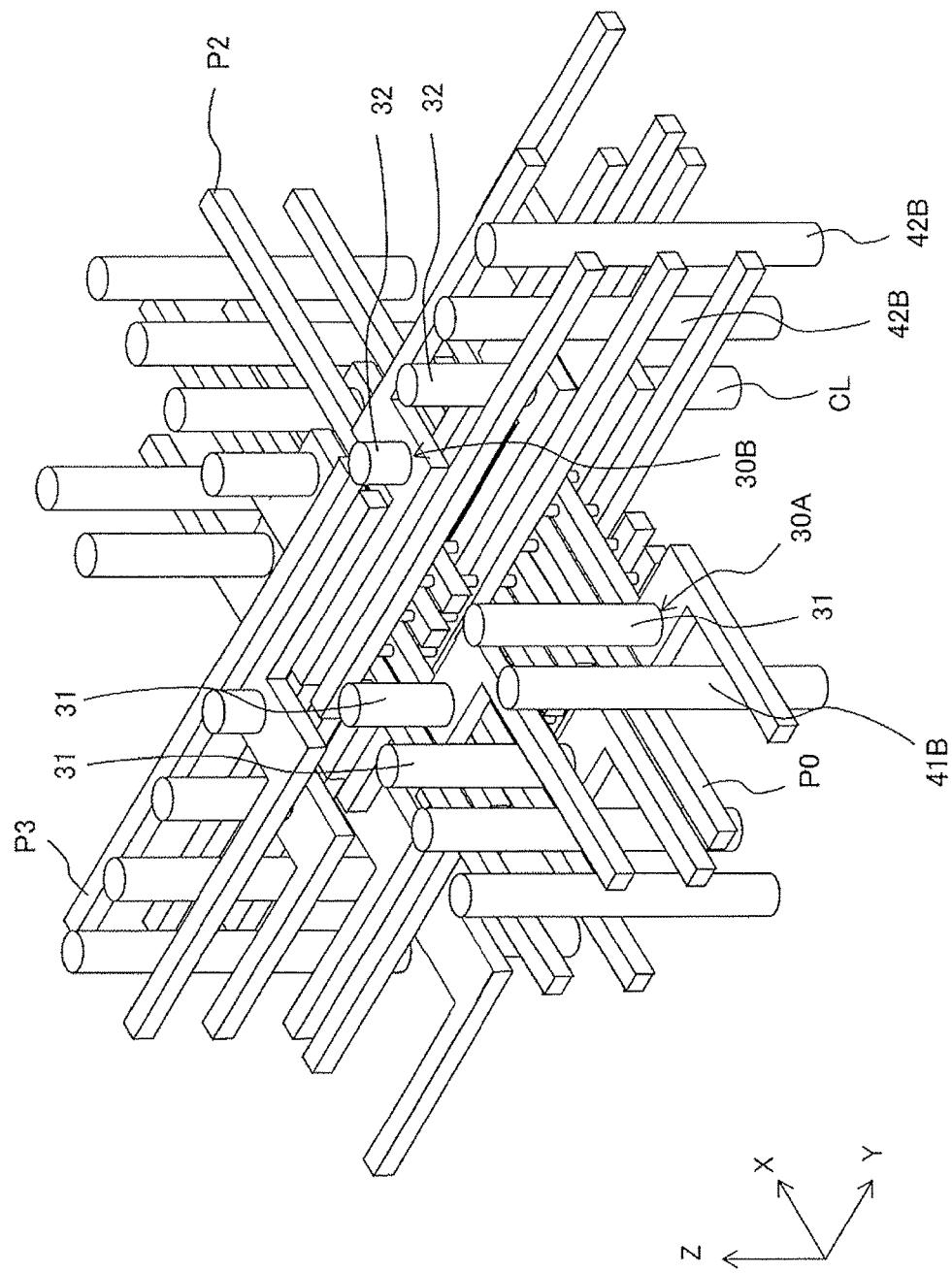
FIG. 14K is a cross-sectional view of one step subsequent to FIG. 14J.

Next, as illustrated in FIG. 14K, a plurality of first contact pillars 31 extending upward from the word line WL and a plurality of second contact pillars 32 extending upward from the bit line BL are formed. In addition, a plurality of pillars 41B and a plurality of pillars 42B each coupled to the drive circuit 4 (see FIG. 11) are formed. It is to be noted that, in FIG. 14K, the substrate 2 and the drive circuit 4 illustrated in FIG. 11 are omitted.

Figure 14L:
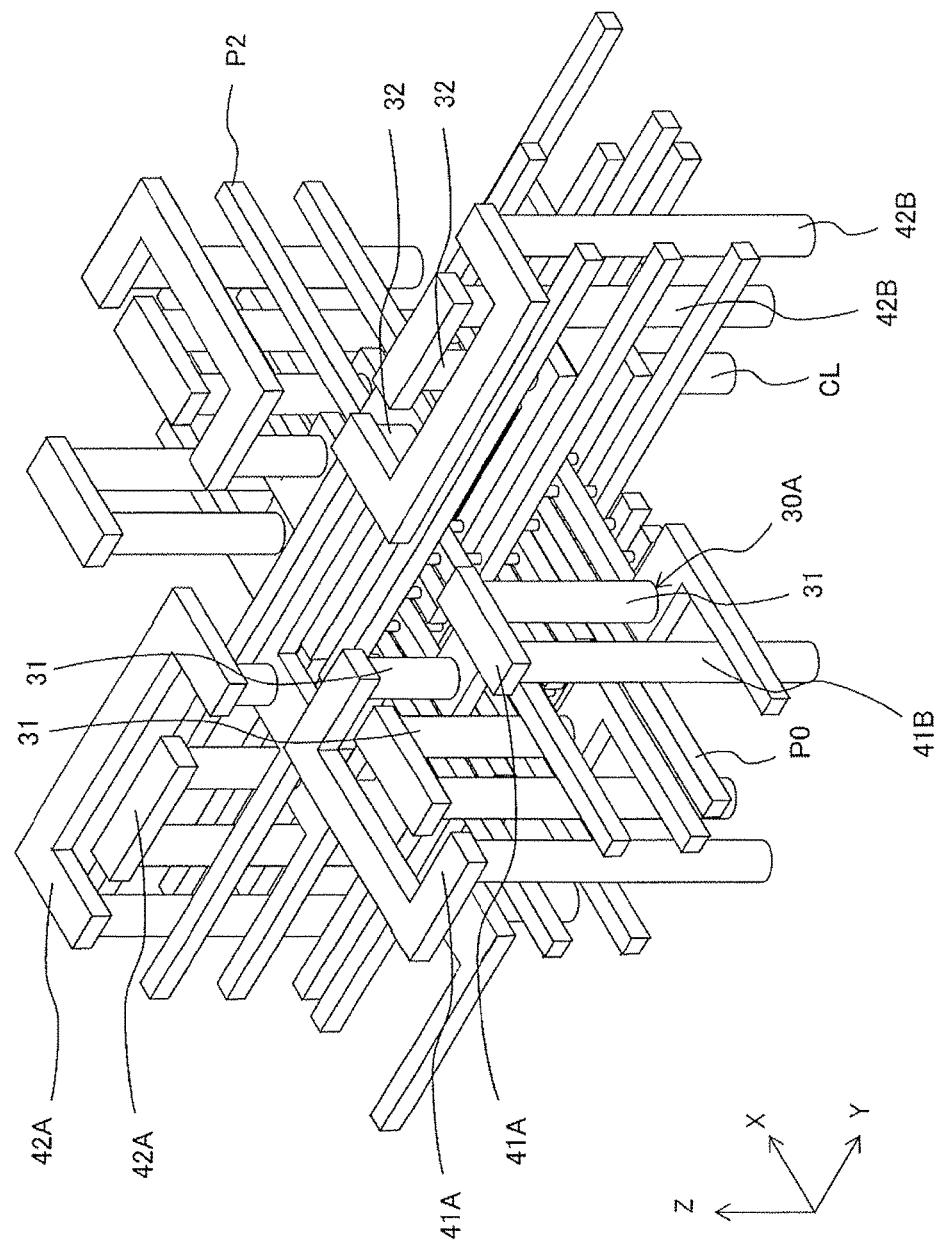
FIG. 14L is a cross-sectional view of one step subsequent to FIG. 14K.

Finally, as illustrated in FIG. 14L, a plurality of beams 41A are formed that each link the first contact pillar 31 and the pillar 41B to each other, and a plurality of beams 42A are formed that each link the second contact pillar 32 and the pillar 42B to each other. It is to be noted that, in FIG. 14L, the substrate 2 and the drive circuit 4 illustrated in FIG. 11 are omitted.

This completes the memory device 1B.

[Workings and Effects of Memory Device 1B]

The memory device 1B also allows the peripheral region PR and the memory cell region MR located at a level different therefrom to overlap each other, thus making it possible to utilize a space efficiently and thus to include more memory cells MC in a predetermined space. Thus, it becomes possible to achieve higher integration. Further, the resistance change element VR has substantially the same planar shape as that of the word line WL or the bit line BL immediately above the resistance change element VR, thus making it possible to simplify the manufacturing process.

5. Third Embodiment

[Configuration of Memory Device 1C]

Figure 15:
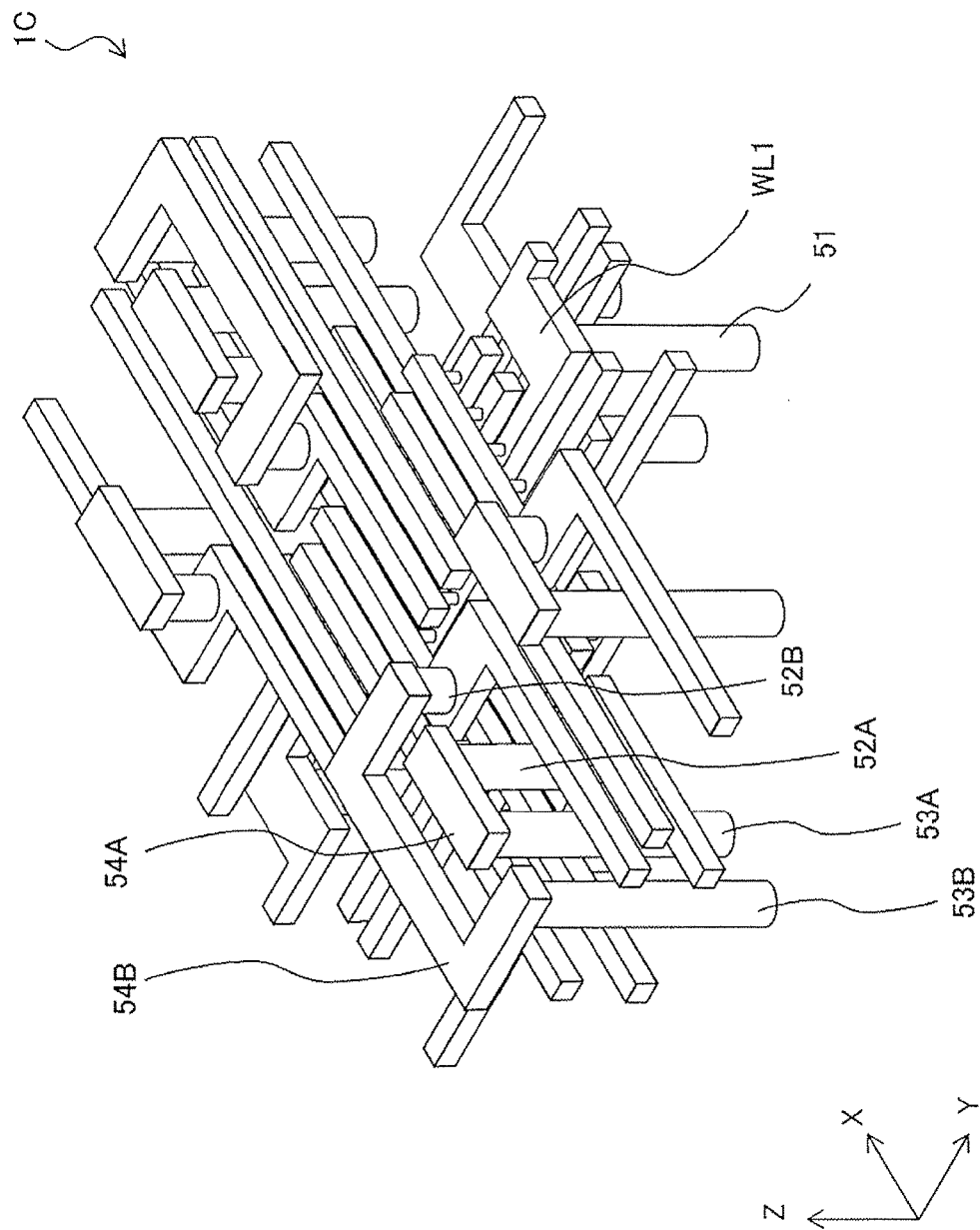
FIG. 15 is a perspective view of an overall configuration example of a memory device according to a third embodiment of the disclosure.
Figure 16:
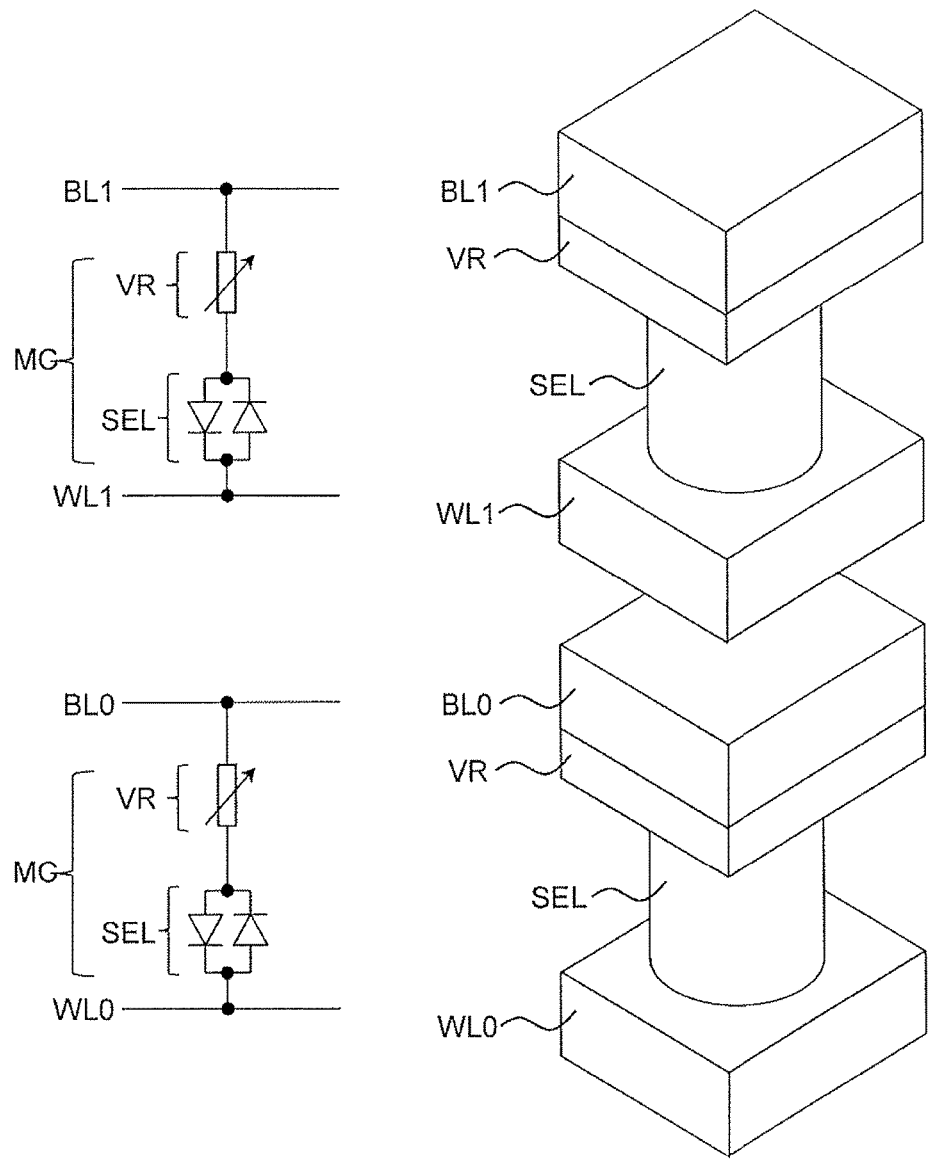
FIG. 16 is an enlarged perspective view of a memory cell to be applied to the memory device illustrated in FIG. 15, together with its equivalent circuit diagram.

FIG. 15 is a perspective view of an overall configuration example of a memory device 1C as a third embodiment of the disclosure. FIG. 16 is an enlarged perspective view of a vicinity of the memory cell MC to be applied to the memory device 1C illustrated in FIG. 15, together with its equivalent circuit diagram. In the memory device 1B of the foregoing second embodiment, the memory cells MC of four layers are formed between the bit lines BL of three layers and the word lines WL of two layers. In a case of such a configuration, three layers of the word line WL0, the bit line BL1, and the word line WL1 are coupled to the memory cells MC of two layers. In a cross-point memory, a leak current flows also to a non-selected memory cell MC; thus, there is a possibility that larger load may be applied to the drive circuit 4 when the number of levels of the memory cell MC is increased. Accordingly, in the memory device 1C of the present embodiment, a structure is attained, in which the memory device 1C includes the memory cells MC, the bit lines BL, and the word lines WL that have the same number of levels and in which each bit line BL and each word line WL are coupled only to the memory cells MC of one layer.

Specifically, as illustrated in FIGS. 15 to 16, in the memory device 1C, the word line WL0, the memory cell MC, the bit line BL0, the insulating layer, the word line WL1, the memory cell MC, the bit line BL1 are stacked in order over the substrate 2 in the Z-axis direction. The memory cell MC has a stacked structure in which the selection element SEL and the resistance change element VR are stacked in order from side of the substrate 2. Further, the resistance change element VR has substantially the same planar shape as that of the bit line BL immediately above the resistance change element VR. Further, the memory device 1C includes a contact pillar 51 that is coupled to the word line WL1 and extends downward (toward the substrate 2). Except this point, the memory device 1C has configurations substantially similar to those of the memory device 1B of the second embodiment.

[Manufacturing Method of Memory Device 1C]

The memory device 1C is able to be manufactured as follows, for example.

Figure 17A:
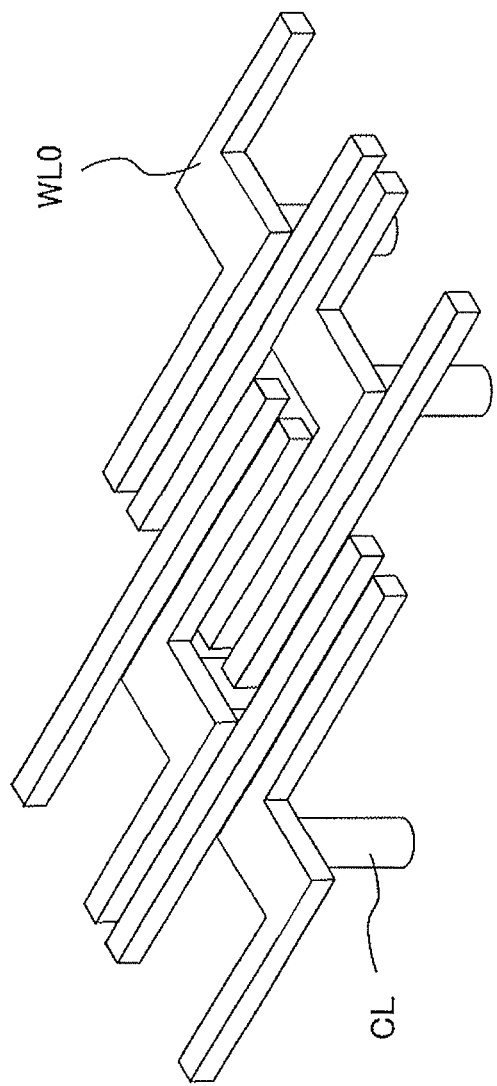
FIG. 17A is a perspective view of one step in a manufacturing method of the memory device illustrated in FIG. 15.

FIGS. 17A to 17G illustrate a portion of a manufacturing method of the memory device 1C in order of steps. First, as illustrated in FIG. 17A, the plurality of contact lines CL stand, following which a plurality of word lines WL0 extending in the Y-axis direction are formed to be arranged in the X-axis direction to be coupled to the contact lines CL.

Figure 17B:
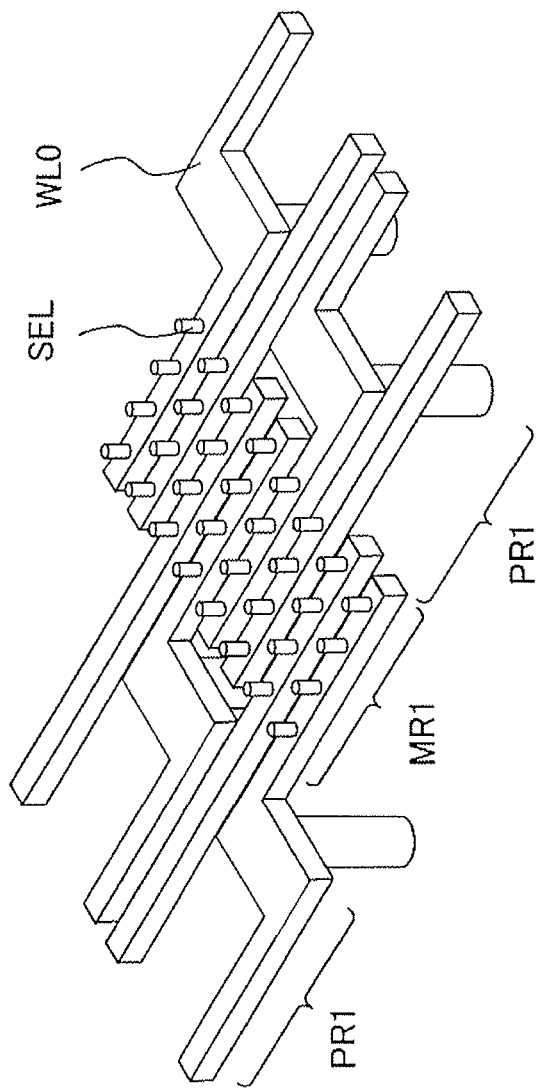
FIG. 17B is a cross-sectional view of one step subsequent to FIG. 17A.

Next, as illustrated in FIG. 17B, the plurality of selection elements SEL are formed into matrix as a whole in the memory cell region MR (MR1). Here, the plurality of (four in an example of FIG. 17B) selection elements SEL stand to be arranged at equal intervals, for example, in the Y-axis direction for one bit line BL0. Both adjacent regions extended from the memory cell region MR along the Y-axis direction are each referred to as the peripheral region (or contact region) PR (PR1). In the peripheral region PR, a portion of the word line WL0 has a bent part having a larger width. This is aimed at allowing for disposition of the contact line CL having a larger diameter than a width of the word line WL0.

Figure 17C:
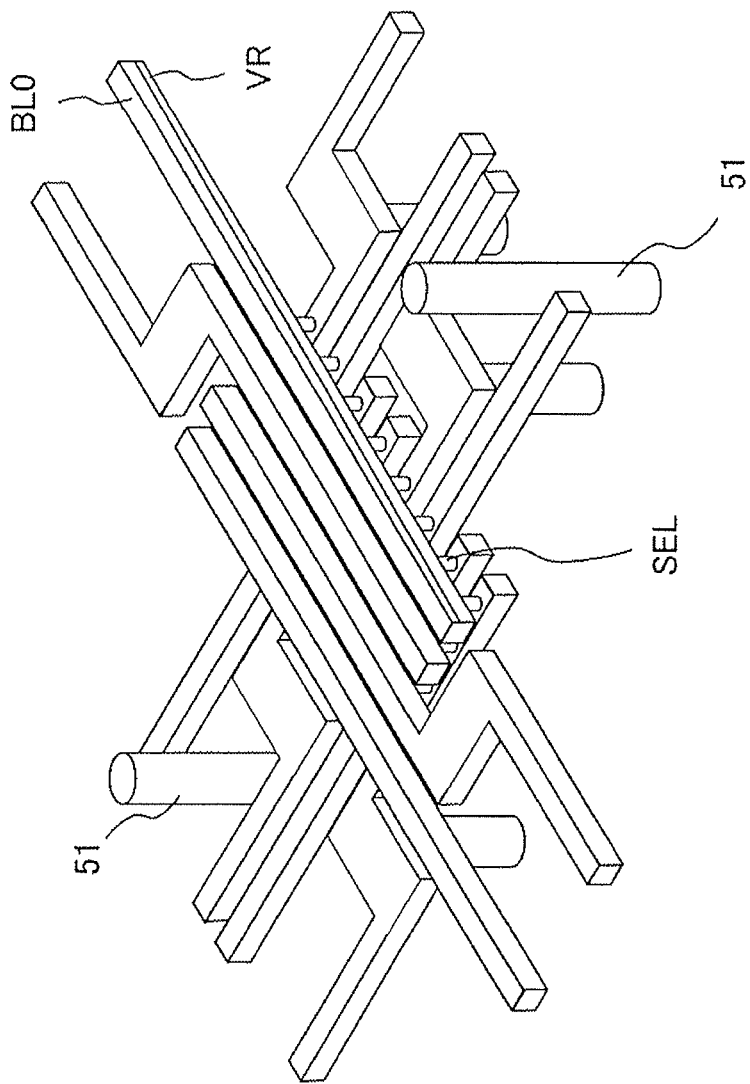
FIG. 17C is a cross-sectional view of one step subsequent to FIG. 17B.

Next, as illustrated in FIG. 17C, as an upper layer of the selection elements SEL, the resistance change element VR and the bit line BL0 are stacked in order all over, and thereafter are patterned collectively to have a plurality of linear patterns extending in substantially the X-axis direction. In this situation, the resistance change element VR extending in the X-axis direction is coupled in common to the plurality of selection elements SEL arranged in the X-axis direction. Further, the contact pillar 51 is formed that is coupled to the word line WL1 to be formed thereafter.

Figure 17D:
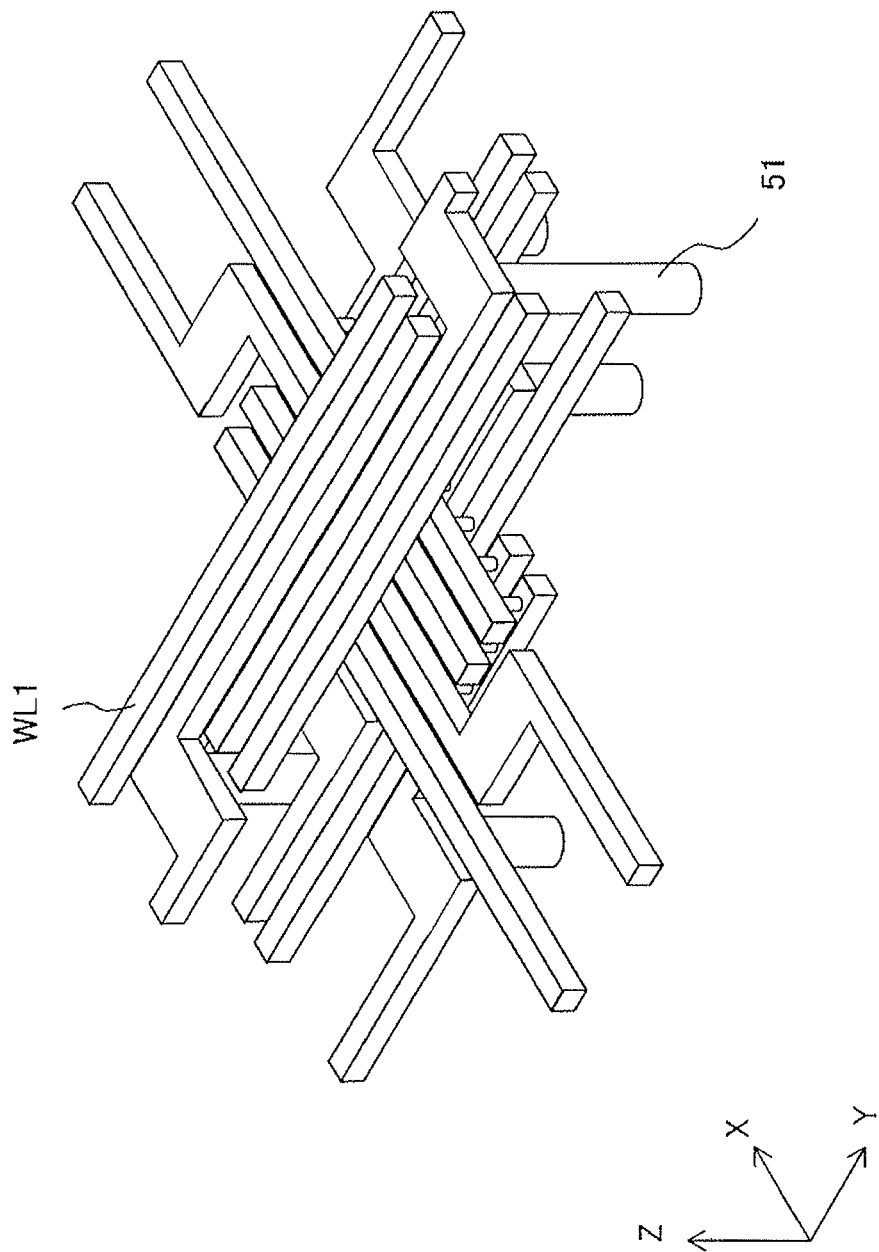
FIG. 17D is a cross-sectional view of one step subsequent to FIG. 17C.

Next, the insulating layer (not illustrated) is formed all over, and thereafter a plurality of word lines WL1 extending in substantially the Y-axis direction are formed, as illustrated in FIG. 17D. In this situation, the word line WL1 is formed to be coupled to an upper end of the contact pillar 51.

Figure 17E:
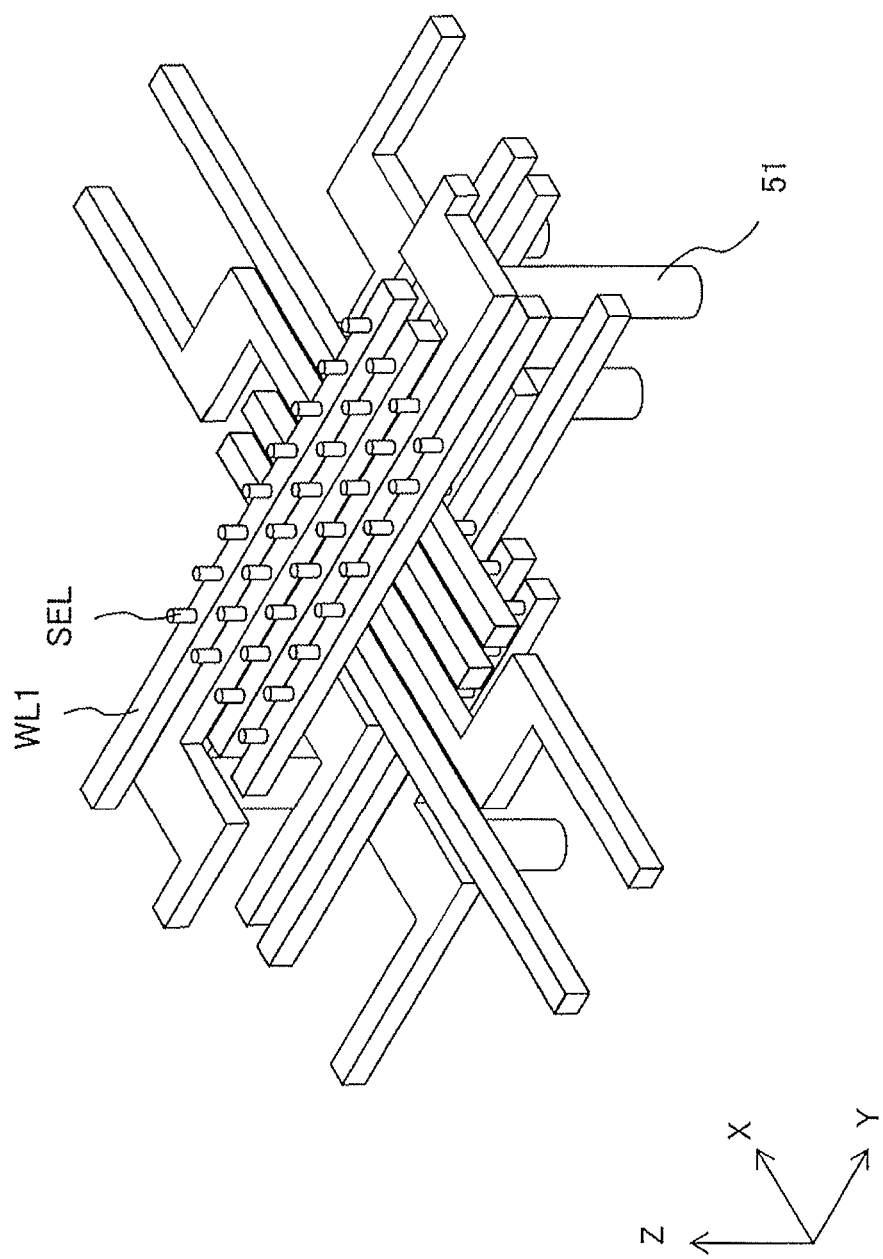
FIG. 17E is a cross-sectional view of one step subsequent to FIG. 17D.

Next, as illustrated in FIG. 17E, the plurality of selection elements SEL are provided in matrix on each of the word lines WL1.

Figure 17F:
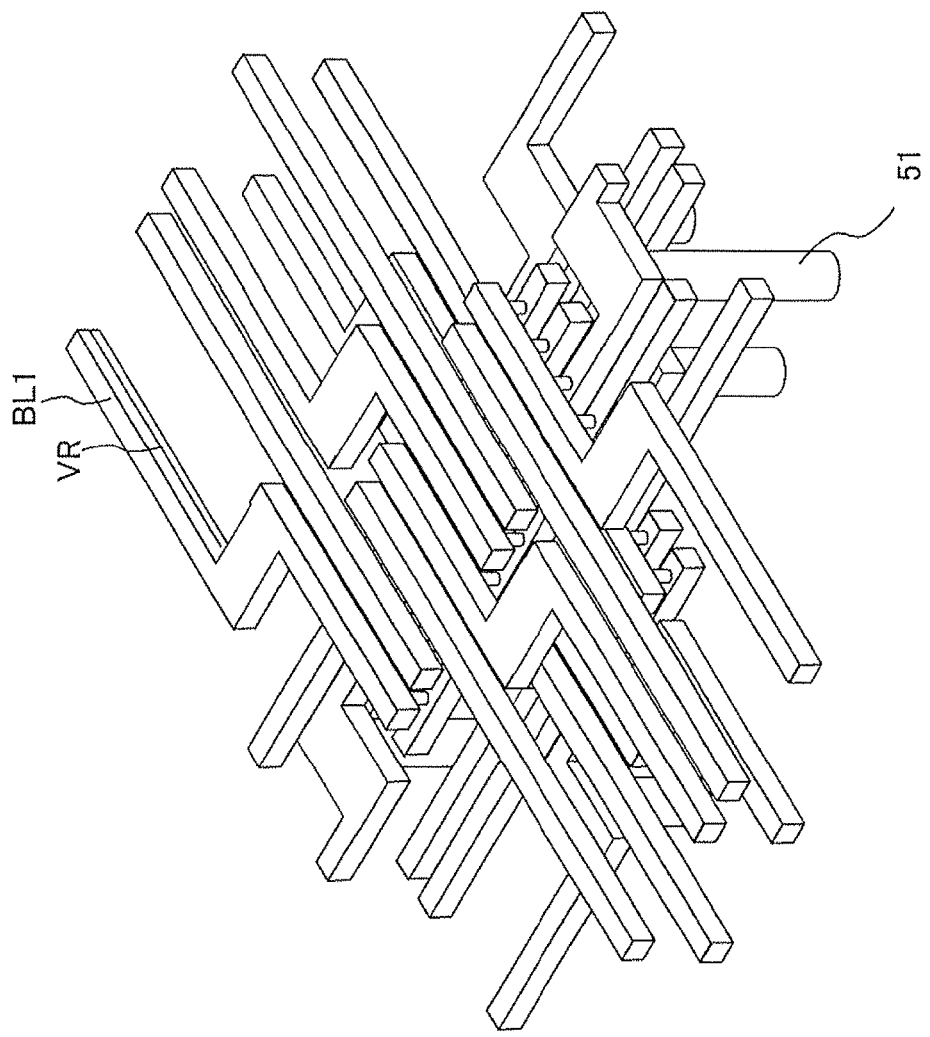
FIG. 17F is a cross-sectional view of one step subsequent to FIG. 17E.

Next, as illustrated in FIG. 17F, as an upper layer of the selection elements SEL, the resistance change element VR and the bit line BL1 are stacked in order all over, and thereafter are patterned collectively to have a plurality of linear patterns extending in substantially the X-axis direction. In this situation, the resistance change element VR extending in the X-axis direction is coupled in common to the plurality of selection elements SEL arranged in the X-axis direction.

Figure 17G:
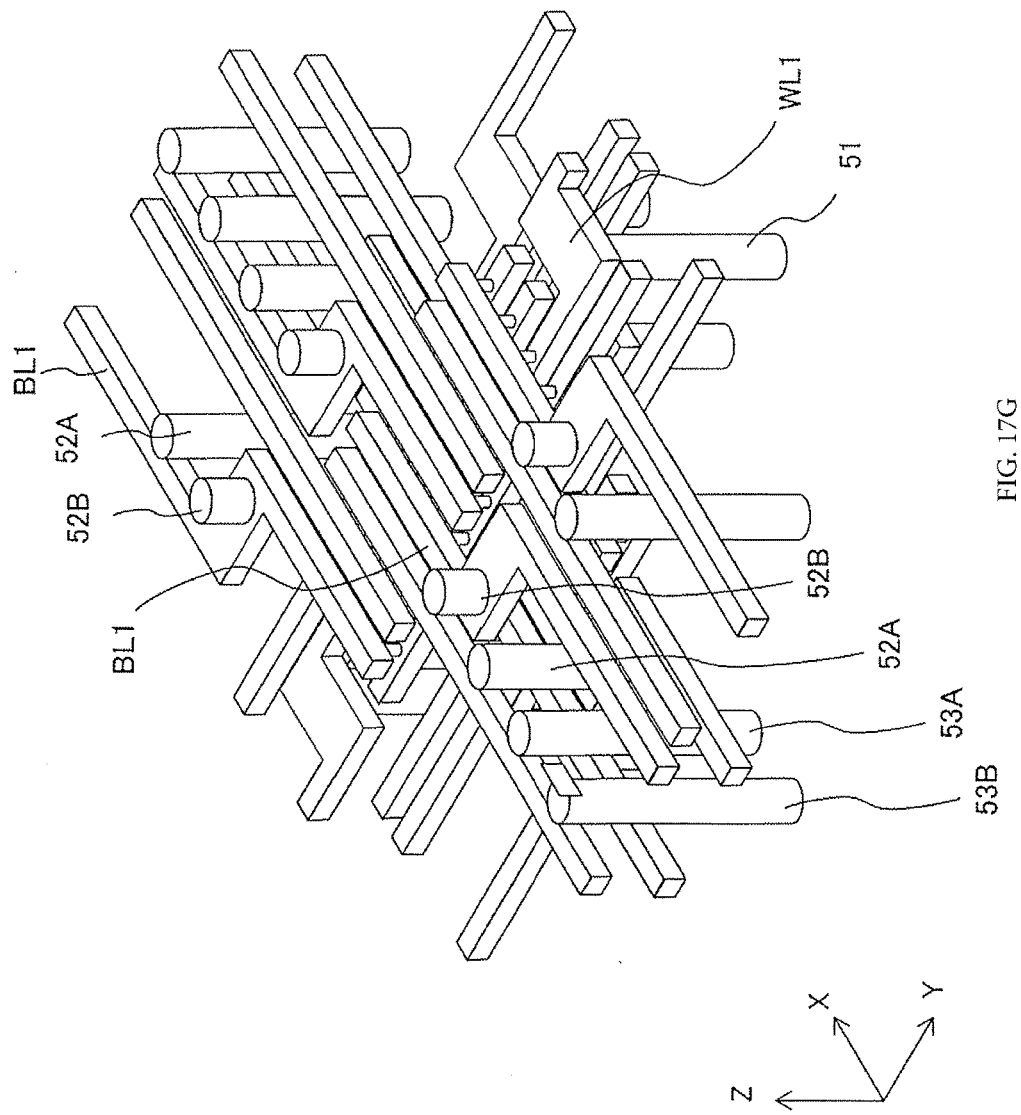
FIG. 17G is a cross-sectional view of one step subsequent to FIG. 17F.

Next, as illustrated in FIG. 17G, a plurality of contact pillars 52A and a plurality of contact pillars 52B are formed that extend upward, respectively, from the bit line BL0 and the bit line BL1. In addition, a plurality of pillars 53A and a plurality of pillars 53B each coupled to the drive circuit 4 are formed.

Finally, as illustrated in FIG. 15, a plurality of beams 54A are formed that each link the contact pillar 52A and the pillar 53A to each other, and a plurality of beams 54B are formed that each link the contact pillar 52B and the pillar 53B to each other.

This completes the memory device 1C.

[Workings and Effects of Memory Device 1C]

The memory device 1B allows the peripheral region PR and the memory cell region MR located at a level different therefrom to overlap each other, thus making it possible to utilize a space efficiently and thus to include more memory cells MC in a predetermined space. Thus, it becomes possible to achieve higher integration. Further, the resistance change element VR has substantially the same planar shape as that of the word line WL or the bit line BL immediately above the resistance change element VR, thus making it possible to simplify the manufacturing process. It is to noted that FIG. 18A illustrates a Y-Z cross-section along the word line WL, and FIG. 18B illustrates an X-Z cross-section along the bit line BL.

Figure 18A:
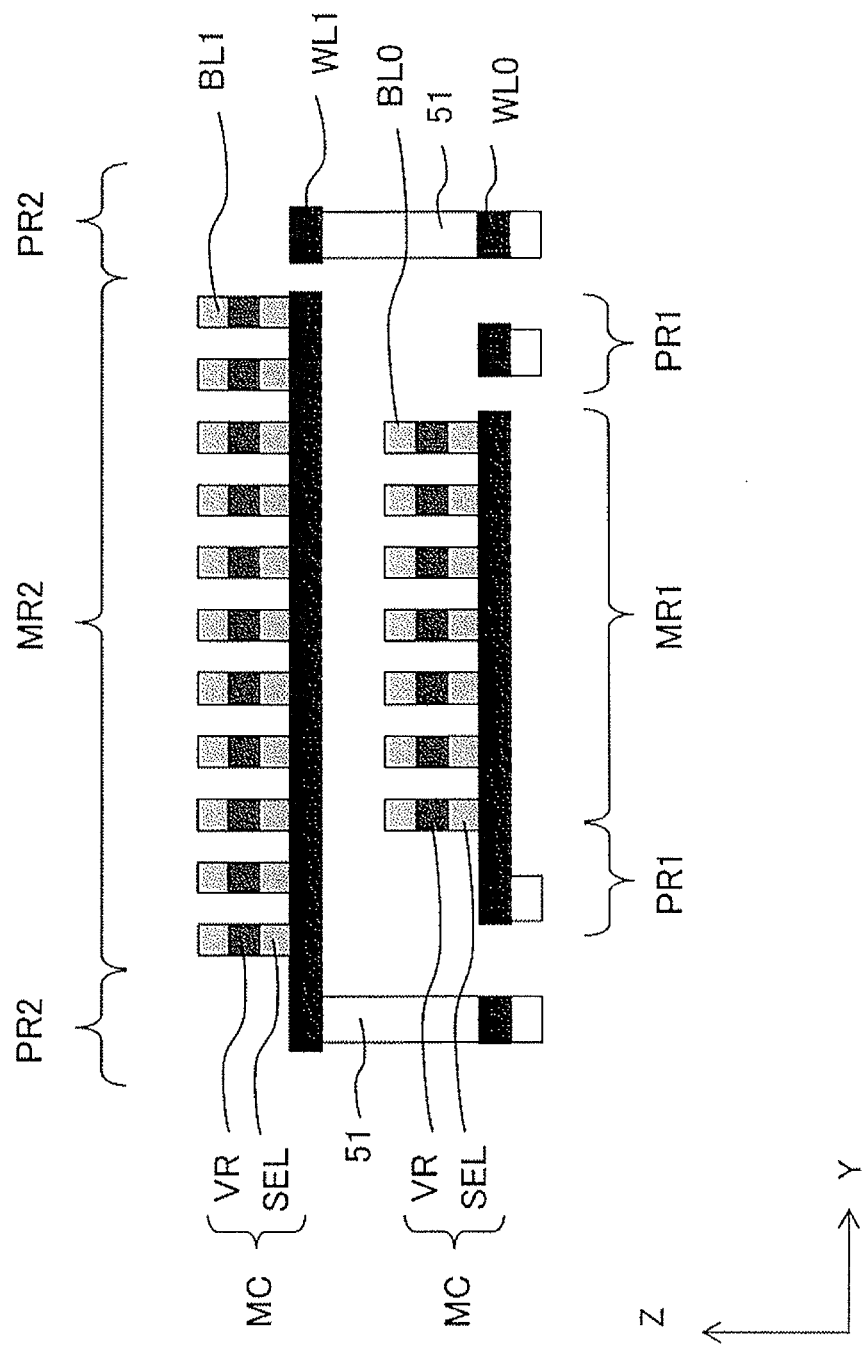
FIG. 18A is a schematic cross-sectional view of a main part of the memory device illustrated in FIG. 15.
Figure 18B:
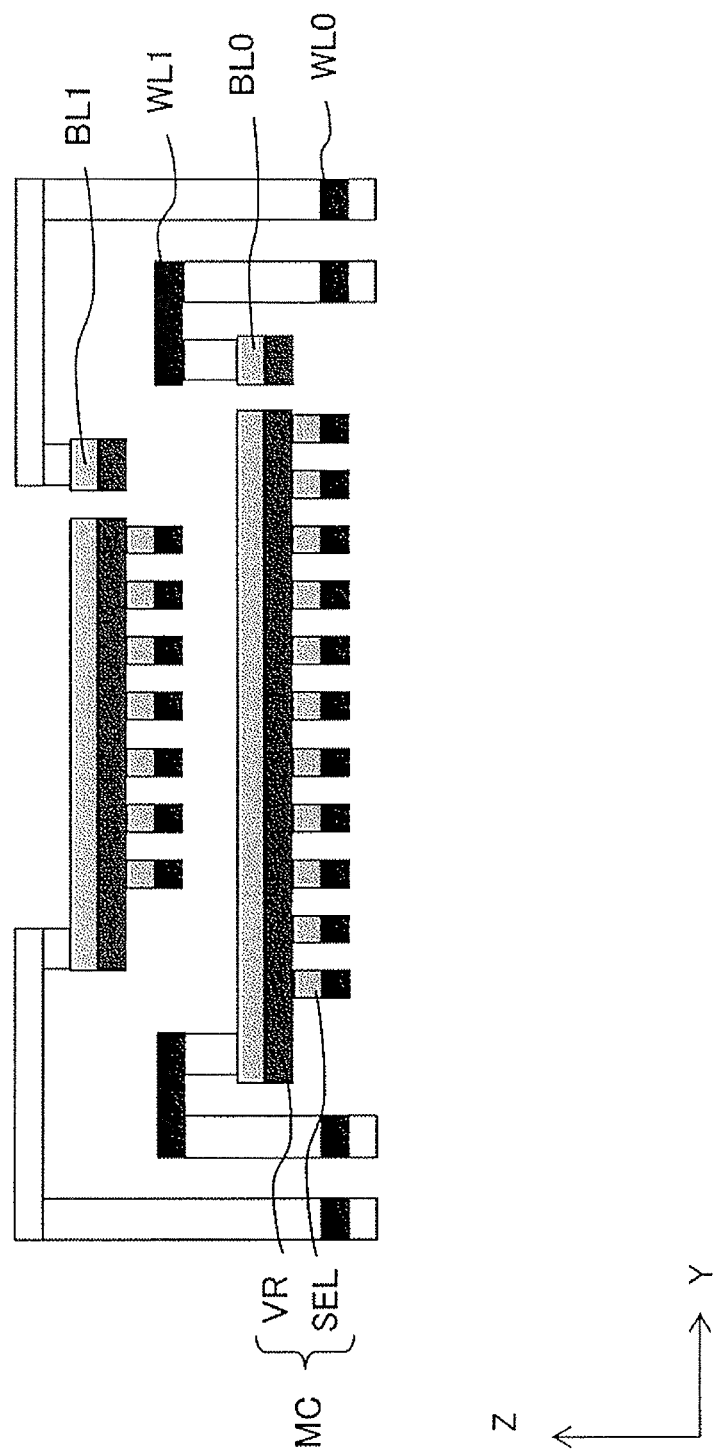
FIG. 18B is another schematic cross-sectional view of the main part of the memory device illustrated in FIG. 15.

As illustrated in FIG. 18A, each word line WL includes the peripheral regions PR at both ends in the Y-axis direction, and is coupled to the drive circuit 4 (not illustrated) by the contact pillars 51 each extending downward. In the memory device 1C of the present embodiment, the word line WL has an overhang structure in which a size of the word line WL in the Y-axis direction is increased as the level becomes higher. In contrast, as illustrated in FIG. 18B, the bit line BL has the stepped structure in which a size of the bit line BL in the X-axis direction is decreased as the level becomes higher. Thus, it becomes possible to collectively form the contact pillar 52 and so forth for each of the bit lines BL.

6. Application Example

Figure 19:
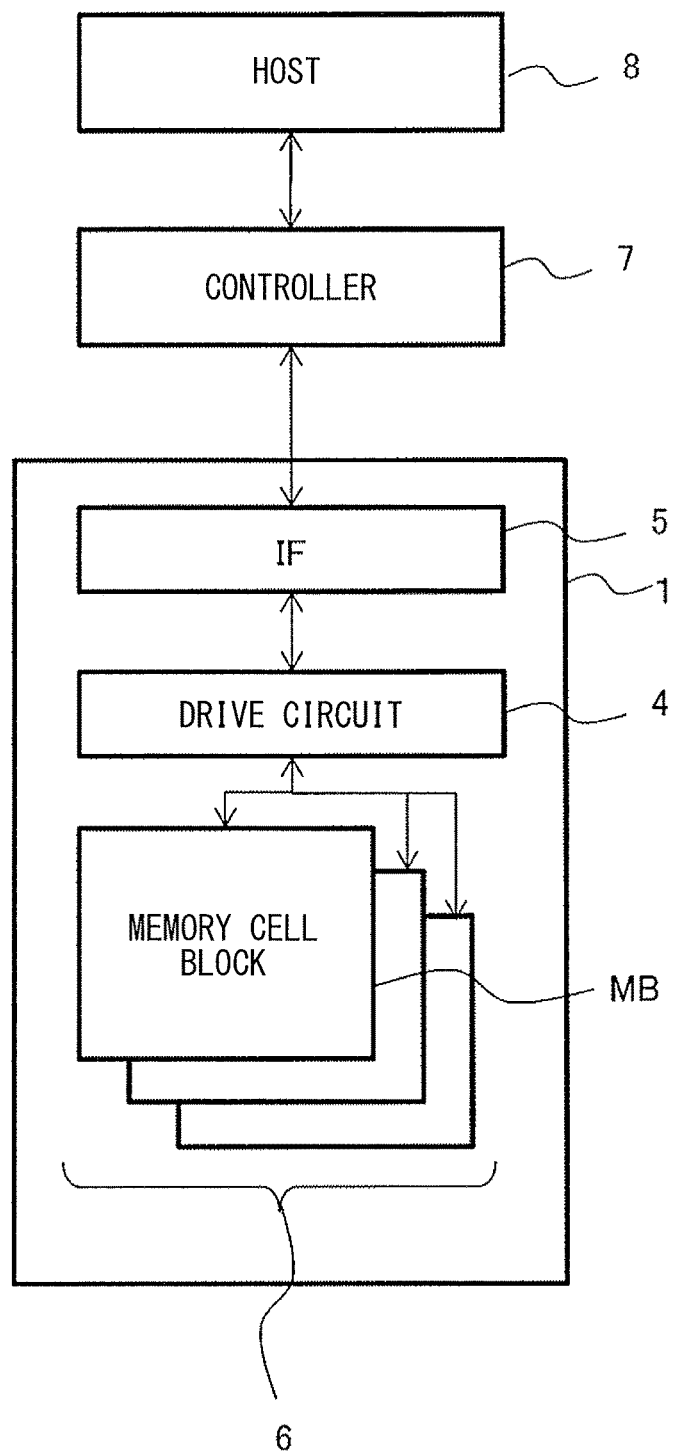
FIG. 19 describes an outline configuration of a memory system that includes the memory device of the disclosure.

Description is given next, with reference to FIG. 19, of a memory system including each of the memory devices 1, 1A, 1B, and 1C (hereinafter, described collectively as the memory device 1) described in the foregoing respective first to third embodiments. The memory system illustrated in FIG. 19 includes, besides the memory device 1, a controller 7 and a host 8. The controller 7 has, as a control section, a function of governing general operations of the memory device 1. The host 8 is an external device that outputs a command to the controller 7.

The memory device 1 includes the memory cell block MB, the drive circuit 4, and an interface section 5. The interface section 5 has functions of transmitting and receiving data to and from the controller 7. The memory cell block MB refers to one integrated form of the plurality of memory cells MC illustrated in FIG. 1, etc. In the memory device 1, a plurality of memory cell blocks MB are coupled to one drive circuit 4. The plurality of memory cell blocks MB coupled to one drive circuit 4 is referred to, collectively, as a memory cell block array 6.

For example, in the memory device 1 illustrated in FIG. 1, four memory cells are surely disposed in one columnar electrode BL (vertical wiring line selected by the GSL and the SL) that penetrates the memory cell units MU1 to MU4 in the Z-axis direction in a region that does not overlap the peripheral region (contact region) PR, i.e., in a region that overlaps the memory cell region MR4. In contrast, only one to three memory cells MC are disposed for the one columnar electrode BL in a region that overlaps any of the peripheral regions (contact regions) PR1 to PR4. Accordingly, in the region that overlaps any of the peripheral regions (contact regions) PR1 to PR4, there is generated an ineffective address where no memory cell MC is present depending on a combination of the selection lines, thus generating a discontinuous address region in a physical address space.

Therefore, in the present memory system, peripheral memory cells MC disposed in the region that overlaps any of the peripheral regions PR (PR1 to PRn) are not used during a normal operation, but are used, as substitutions, in a case where, for example, access failure occurs to other memory cells MC. In order to perform such a substitution process, it is desirable for the controller 7 to include an address conversion table. The address conversion table is installed as a function. For example, when an address of a memory cell MC to be accessed is inputted, the address conversion table as a function returns an address of the substituted memory cell MC when the substitution process is performed, and returns zero when the substitution process is not performed. In this manner, by assigning the peripheral memory cell MC as an address to be used for the substitution process, it becomes possible to cause the host 8 to recognize the memory device as a continuous address region, thus allowing for easy handleability.

Further, in a case where the resistance change element VR is used as the memory cell MC, it is necessary to perform an initial process referred to as forming, depending on its characteristics, before initial writing after the production thereof. More specifically, as the forming, one or more of the following operations are performed. The operations include: (1) applying a higher voltage; (2) applying for a longer period of time; and (3) applying a plurality of pulses more continuously, than a pulse to be applied to the memory cell MC in a normal writing process. It is desirable that the peripheral memory cell MC to be used for the above-described substitution process be subjected to the forming at the time of the substitution. This is because there is a possibility that, selection of the plate-shaped electrode WL and the columnar electrode BL for access to any other memory cell instead of direct access to a memory cell to be used for the substitution process may cause a leak current to flow also to the memory cell to deteriorate characteristics as the memory cell. A memory cell not having been subjected to the forming, i.e., a memory cell in a state of not having been subjected to the forming even once after production is preferable because the deterioration is smaller than that of the memory cell having been subjected to the forming.

Further, upon formation of the plurality of memory cells MC in a normal thin-film process, the plurality of memory cells MC formed at a position close to the middle in a certain direction tends to exhibit more stable characteristics than those located at both ends. From this point of view, in the present memory system, instead of using the peripheral memory cells MC, use of other memory cells MC during the normal operation enables a more stable operation to be expected.

Although description has been given hereinabove referring to the embodiment, the disclosure is not limited to the foregoing embodiment and may be modified in a variety of ways.

Description has been given specifically referring to, for example, the configuration such as the memory device 1 and the memory system in the foregoing embodiments; however, all of the components are not necessarily included. Any other component may be further included.

Further, in the foregoing embodiment, etc., the resistance change element (resistance change memory) is used as the memory cell; however, the technology is not limited thereto. For example, other types of memories such as a phase-change memory (PCM), MRAM, and STTRAM may be used.

Further, the numbers of the respective components described in the foregoing embodiments, etc. are merely examples. Thus, the technology is not limited thereto, and may have any other number thereof.

It is to be noted that the effects described herein are merely examples, and are not limited thereto; the effects may further include other effects. Moreover, the technology may have the following configurations.

(1)

A memory device including n-number of memory cell units that are provided on a substrate and stacked in order as a first memory cell unit to an n-th memory cell unit in a first direction, the n-number of memory cell units each including one or more first electrodes, a plurality of second electrodes each provided to intersect the first electrode, a plurality of memory cells provided at respective intersections of the first electrode and the plurality of second electrodes, and each coupled to both of the first electrode and the second electrode, and one or more lead lines that are coupled to the first electrode to form one or more coupling parts, the one or more coupling parts in an (m+1)-th memory cell unit of the memory cell units being located at a position where the one or more coupling parts and an m-th memory cell region overlap each other in the first direction, where m denotes a natural number equal to or smaller than n, the m-th memory cell region being surrounded by the plurality of memory cells in an m-th memory cell unit of the memory cell units.

(2)
The memory device according to (1), in which the coupling part in the (m+1)-th memory cell unit is located at a position where the coupling part and the plurality of memory cells in the m-th memory cell unit overlap each other in the first direction.

(3)
The memory device according to (1) or (2), in which an (m+1)-th memory cell region surrounded by the plurality of memory cells in the (m+1)-th memory cell unit is narrower than the m-th memory cell region.

(4)
The memory device according to any one of (1) to (3), in which the number of the plurality of memory cells in the (m+1)-th memory cell unit is smaller than the number of the plurality of memory cells in the m-th memory cell unit.

(5)
The memory device according to any one of (1) to (4), in which
the memory cell includes a resistance change element including a stacked structure of an ion supply layer and an insulating layer, and
the resistance change element is interposed between the first electrode and the second electrode.

(6)
The memory device according to any one of (1) to (5), further including a drive circuit coupled to the lead line.

(7)
The memory device according to any one of (1) to (6), in which
the first electrode includes a plate-shaped electrode that extends along a first surface that is orthogonal to the first direction,
the plurality of second electrodes include a plurality of columnar electrodes each stand from the plate-shaped electrode toward the substrate, and
the plate-shaped electrode in the (m+1)-th memory cell unit has an occupation area that is smaller than an occupation area of the plate-shaped electrode in the m-th memory cell unit.

(8)
The memory device according to any one of (1) to (6), in which
the first electrode includes a plurality of first linear electrodes and a plurality of second electrodes that each extend in a second direction along a first surface that is orthogonal to the first direction, and are arranged alternately in a third direction along the first surface,
the plurality of second electrodes include a plurality of columnar electrodes each interposed between the first linear electrode and the second linear electrode that are adjacent to each other,
the plurality of memory cells include a plurality of storage layers each interposed between corresponding one of the plurality of the columnar electrodes and corresponding one of each of the plurality of first linear electrodes and the plurality of second linear electrodes, the first linear electrodes and the second linear electrodes facing each other to interpose the columnar electrodes, and
the lead line includes a first contact pillar that forms a first coupling part as the coupling part through coupling to the first linear electrode, and a second contact pillar that forms a second coupling part as the coupling part through coupling to the second linear electrode.

(9)
The memory device according to (8), in which
the first linear electrode in the (m+1)-th memory cell unit has a size, in the second direction, that is smaller than a size, in the second direction, of the first linear electrode in the m-th memory cell unit, and
the second linear electrode in the (m+1)-th memory cell unit has a size, in the second direction, that is smaller than a size, in the second direction, of the second linear electrode in the m-th memory cell unit.

(10)
The memory device according to (8) or (9), in which
a plurality of the first contact pillars coupled to the respective first linear electrodes in the m-th memory cell unit are coupled in common to one of first beams, and
a plurality of the second contact pillars coupled to the respective second linear electrodes in the m-th memory cell unit are coupled in common to one of second beams.

(11)
The memory device according to (7), further including a plurality of selection lines that are arranged in a second direction along the first surface, and extend in a third direction orthogonal to the second direction along the first surface, the plurality of selection lines being each coupled to the plurality of second electrodes that are arranged in the third direction.

(12)
The memory device according to any one of (1) to (6), in which
the plurality of second electrodes, the plurality of memory cells, and the plurality of first electrodes are stacked in order from side of the substrate in the first direction,
the plurality of memory cells each have a stacked structure in which a resistance change element and a selection element are stacked in order on corresponding one of the plurality of second electrodes, and
the resistance change element has a planar shape that is substantially same as one of the plurality of first electrodes.

(13)
The memory device according to (12), in which
the plurality of first electrodes are disposed to each extend in a second direction along the first surface and to be arranged in a third direction orthogonal to the second direction,
the plurality of second electrodes are disposed to each extend in the third direction and to be arranged in the second direction,
a plurality of the selection elements are disposed to be arranged in both of the second direction and the third direction, and
the single resistance change element is coupled in common to the plurality of the selection elements that are arranged in one of the second direction and the third direction.

(14)
The memory device according to (12) or (13), in which
an (m+1)-th memory cell region surrounded by the plurality of memory cells in the (m+1)-th memory cell unit is narrower than the m-th memory cell region, and
the lead line includes a first contact pillar and a second contact pillar, the first contact pillar forming a first coupling part as the coupling part through coupling to the first electrode and extending to be away from the substrate, the second contact pillar forming a second coupling part as the coupling part through coupling to the second electrode and extending to be away from the substrate.

(15)

The memory device according to (14), further including:

a drive circuit provided between the substrate and a first memory cell unit of the memory cell units;

a first wiring line that couples an upper end of the first contact pillar and the drive circuit to each other; and a second wiring line that couples an upper end of the second contact pillar and the drive circuit to each other.

(16)

The memory device according to (12) or (13), in which the lead line includes a first contact pillar and a second contact pillar, the first contact pillar forming a first coupling part as the coupling part through coupling to the first electrode and extending to be away from the substrate, the second contact pillar forming a second coupling part as the coupling part through coupling to the second electrode and extending toward the substrate.

(17)

The memory device according to (16), further including:

a drive circuit provided between the substrate and a first memory cell unit of the memory cell units;

a first wiring line that couples an upper end of the first contact pillar and the drive circuit to each other; and a second wiring line that couples a lower end of the second contact pillar and the drive circuit to each other.

(18)

A memory system including:

a memory device; and a controller that controls the memory device, the memory device being provided with n-number of memory cell units that are provided on a substrate and stacked in order as a first memory cell unit to an n-th memory cell unit in a first direction, the n-number of memory cell units each including one or more first electrodes, a plurality of second electrodes each provided to intersect the first electrode, a plurality of memory cells provided at respective intersections of the first electrode and the plurality of second electrodes, the plurality of memory cells each coupled to both of the first electrode and the second electrode, and one or more lead lines that are coupled to the first electrode to form one or more coupling parts, the one or more coupling parts in an (m+1)-th memory cell unit of the memory cell units being located at a position where the one or more coupling parts and an m-th memory cell region overlap each other in the first direction, the m-th memory cell region being surrounded by the plurality of memory cells in an m-th memory cell unit of the memory cell units, where m denotes a natural number equal to or smaller than n.

(19)

The memory system according to (18), in which the memory cell provided in a peripheral region, of the m-th memory cell region, serves as a spare memory cell, the peripheral region being a region other than a region that is overlapped, in the first direction, by an (m+1)-th memory cell region surrounded by the plurality of memory cells in the (m+1)-th memory cell unit.

This application is based upon and claims priority from Japanese Patent Application No. 2015-117228 filed with the Japan Patent Office on Jun. 10, 2015, the entire contents of which are hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A memory device comprising n-number of memory cell units that are provided on a substrate and stacked in order as a first memory cell unit to an n-th memory cell unit in a first direction, the n-number of memory cell units each including one or more first electrodes, a plurality of second electrodes each provided to intersect the first electrode, a plurality of memory cells provided at respective intersections of the first electrode and the plurality of second electrodes, and each coupled to both of the first electrode and a corresponding one of the second electrodes, and one or more lead lines that are coupled to the first electrode to form one or more coupling parts, the one or more coupling parts in an (m+1)-th memory cell unit of the memory cell units being located at a position where the one or more coupling parts and an m-th memory cell region overlap each other in the first direction, where m denotes a natural number equal to or smaller than n, the m-th memory cell region being surrounded by the plurality of memory cells in an m-th memory cell unit of the memory cell units, wherein the one or more coupling parts in the (m+1)-th memory cell unit are located at a position where the one or more coupling parts and the plurality of memory cells in the m-th memory cell unit overlap each other in the first direction.

2. The memory device according to claim 1, wherein an (m+1)-th memory cell region surrounded by the plurality of memory cells in the (m+1)-th memory cell unit is narrower than the m-th memory cell region.

3. The memory device according to claim 1, wherein the number of the plurality of memory cells in the (m+1)-th memory cell unit is smaller than the number of the plurality of memory cells in the m-th memory cell unit.

4. The memory device according to claim 1, wherein the plurality of memory cells each include a resistance change element including a stacked structure of an ion supply layer and an insulating layer, and the resistance change element is interposed between the first electrode and the second electrode.

5. The memory device according to claim 1, further comprising a drive circuit coupled to the lead line.

6. The memory device according to claim 1, wherein the first electrode comprises a plate-shaped electrode that extends along a first surface that is orthogonal to the first direction, the plurality of second electrodes comprise a plurality of columnar electrodes that each stand from the plate-shaped electrode toward the substrate, and the plate-shaped electrode in the (m+1)-th memory cell unit has an occupation area that is smaller than an occupation area of the plate-shaped electrode in the m-th memory cell unit.

7. The memory device according to claim 6, further comprising a plurality of selection lines that are arranged in a second direction along the first surface, and extend in a third direction orthogonal to the second direction along the first surface, the plurality of selection lines being each coupled to the plurality of second electrodes that are arranged in the third direction.

8. The memory device according to claim 1, wherein
the first electrode comprises a plurality of first linear electrodes and a plurality of second linear electrodes that each extend in a second direction along a first surface that is orthogonal to the first direction, and are arranged alternately in a third direction along the first surface,
the plurality of second electrodes comprise a plurality of columnar electrodes each interposed between the first linear electrode and the second linear electrode that are adjacent to each other,
the plurality of memory cells comprise a plurality of storage layers each interposed between corresponding one of the plurality of the columnar electrodes and corresponding one of each of the plurality of first linear electrodes and the plurality of second linear electrodes, the first linear electrodes and the second linear electrodes facing each other to interpose the columnar electrodes, and
the lead line comprises a first contact pillar that forms a first coupling part as the coupling part through coupling to the first linear electrode, and a second contact pillar that forms a second coupling part as the coupling part through coupling to the second linear electrode.

9. The memory device according to claim 8, wherein
the first linear electrode in the (m+1)-th memory cell unit has a size, in the second direction, that is smaller than a size, in the second direction, of the first linear electrode in the m-th memory cell unit, and
the second linear electrode in the (m+1)-th memory cell unit has a size, in the second direction, that is smaller than a size, in the second direction, of the second linear electrode in the m-th memory cell unit.

10. The memory device according to claim 8, wherein
a plurality of the first contact pillars coupled to the respective first linear electrodes in the m-th memory cell unit are coupled in common to one of first beams, and
a plurality of the second contact pillars coupled to the respective second linear electrodes in the m-th memory cell unit are coupled in common to one of second beams.

11. The memory device according to claim 1, wherein
the plurality of second electrodes, the plurality of memory cells, and the plurality of first electrodes are stacked in order from side of the substrate in the first direction,
the plurality of memory cells each have a stacked structure in which a resistance change element and a selection element are stacked in order on corresponding one of the plurality of second electrodes, and
the resistance change element has a planar shape that is substantially same as one of the plurality of first electrodes.

12. The memory device according to claim 11, wherein
the plurality of first electrodes are disposed to each extend in a second direction along the first surface and to be arranged in a third direction orthogonal to the second direction,
the plurality of second electrodes are disposed to each extend in the third direction and to be arranged in the second direction,
a plurality of the selection elements are disposed to be arranged in both of the second direction and the third direction, and the single resistance change element is coupled in common to the plurality of the selection elements that are arranged in one of the second direction and the third direction.

13. The memory device according to claim 11, wherein
an (m+1)-th memory cell region surrounded by the plurality of memory cells in the (m+1)-th memory cell unit is narrower than the m-th memory cell region, and
the lead line comprises a first contact pillar and a second contact pillar, the first contact pillar forming a first coupling part as the coupling part through coupling to the first electrode and extending to be away from the substrate, the second contact pillar forming a second coupling part as the coupling part through coupling to the second electrode and extending to be away from the substrate.

14. The memory device according to claim 13, further comprising:
a drive circuit provided between the substrate and a first memory cell unit of the memory cell units;
a first wiring line that couples an upper end of the first contact pillar and the drive circuit to each other; and
a second wiring line that couples an upper end of the second contact pillar and the drive circuit to each other.

15. The memory device according to claim 11, wherein
the lead line comprises a first contact pillar and a second contact pillar, the first contact pillar forming a first coupling part as the coupling part through coupling to the first electrode and extending to be away from the substrate, the second contact pillar forming a second coupling part as the coupling part through coupling to the second electrode and extending toward the substrate.

16. The memory device according to claim 15, further comprising:
a drive circuit provided between the substrate and a first memory cell unit of the memory cell units;
a first wiring line that couples an upper end of the first contact pillar and the drive circuit to each other; and
a second wiring line that couples a lower end of the second contact pillar and the drive circuit to each other.

17. A memory system comprising:
a memory device; and
a controller that controls the memory device,
the memory device being provided with n-number of memory cell units that are provided on a substrate and stacked in order as a first memory cell unit to an n-th memory cell unit in a first direction, the n-number of memory cell units each including
one or more first electrodes,
a plurality of second electrodes each provided to intersect the first electrode,
a plurality of memory cells provided at respective intersections of the first electrode and the plurality of second electrodes, the plurality of memory cells each coupled to both of the first electrode and a corresponding one of the second electrodes, and
one or more lead lines that are coupled to the first electrode to form one or more coupling parts, the one or more coupling parts in an (m+1)-th memory cell unit of the memory cell units being located at a position where the one or more coupling parts and an m-th memory cell region overlap each other in the first direction, the m-th memory cell region being surrounded by the plurality of memory cells in an m-th memory cell unit of the memory cell units, where m denotes a natural number equal to or smaller than n, wherein the one or more coupling parts in the (m+1)-th memory cell unit are located at a position where the one or more coupling parts and the plurality of memory cells in the m-th memory cell unit overlap each other in the first direction.

18. The memory system according to claim 17, wherein the memory cell provided in a peripheral region, of the m-th memory cell region, serves as a spare memory cell, the peripheral region being a region other than a region that is overlapped, in the first direction, by an (m+1)-th memory cell region surrounded by the plurality of memory cells in the (m+1)-th memory cell unit.

\* \* \* \* \*